United States Patent
Dehe et al.

(12)

(10) Patent No.: US 10,560,771 B2
(45) Date of Patent: Feb. 11, 2020

(54) MICROELECTROMECHANICAL MICROPHONE

(71) Applicant: Infineon Technologies AG, Neubiberg (DE)

(72) Inventors: Alfons Dehe, Villingen-Schwenning (DE); Gerhard Metzger-Brueckl, Geisenfeld (DE); Johann Strasser, Schierling (DE); Arnaud Walther, Unterhaching (DE); Andreas Wiesbauer, Poertschach (AT)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 16/052,261

(22) Filed: Aug. 1, 2018

(65) Prior Publication Data
US 2019/0058936 A1    Feb. 21, 2019

(30) Foreign Application Priority Data

Aug. 18, 2017    (DE) ..................... 10 2017 118 857

(51) Int. Cl.
*H04R 1/06*    (2006.01)
*H04R 1/08*    (2006.01)
(Continued)

(52) U.S. Cl.
CPC ............. *H04R 1/08* (2013.01); *B81B 3/0021* (2013.01); *B81C 1/00158* (2013.01);
(Continued)

(58) Field of Classification Search
CPC ...... H04R 1/08; H04R 23/006; H04R 31/003; B81B 3/0021; B81C 1/00158
See application file for complete search history.

(56) References Cited

U.S. PATENT DOCUMENTS

2012/0025334 A1* 2/2012 Chan .................... H04R 19/005
257/416
2013/0264663 A1 10/2013 Dehe et al.
(Continued)

FOREIGN PATENT DOCUMENTS

DE    102006055147 A1    5/2008
DE    102013205527 A1    10/2013
(Continued)

*Primary Examiner* — Dung A. Le
(74) *Attorney, Agent, or Firm* — Slater Matsil, LLP

(57) ABSTRACT

In accordance with an embodiment, microelectromechanical microphone includes a holder and a sound detection unit carried on the holder. The sound detection unit includes a planar first membrane, a planar second membrane arranged at a distance from the first membrane, a low-pressure chamber formed between the first membrane and the second membrane, a reduced gas pressure relative to normal pressure being present in the low-pressure chamber, a reference electrode arranged at least in sections in the low-pressure chamber, where the first and second membranes are displaceable relative to the reference electrode by sound waves to be detected, the reference electrode includes a planar base section and a stiffening structure provided on the base section, and the stiffening structure is provided on a side of the base section that faces the first membrane or/and on a side of the base section that faces the second membrane.

25 Claims, 28 Drawing Sheets

(51) Int. Cl.
*B81B 3/00* (2006.01)
*B81C 1/00* (2006.01)
*H04R 23/00* (2006.01)
*H04R 31/00* (2006.01)

(52) U.S. Cl.
CPC ....... *B81C 1/00182* (2013.01); *H04R 23/006* (2013.01); *H04R 31/003* (2013.01); *B81B 2201/0257* (2013.01); *B81B 2201/0264* (2013.01); *B81B 2203/0127* (2013.01); *H04R 2201/003* (2013.01); *H04R 2410/03* (2013.01)

(56) References Cited

U.S. PATENT DOCUMENTS

| | | |
|---|---|---|
| 2014/0210020 A1 | 7/2014 | Dehe |
| 2015/0001647 A1 | 1/2015 | Dehe et al. |
| 2016/0023890 A1* | 1/2016 | Reinmuth ............. B81B 7/0061 257/419 |
| 2018/0208455 A1* | 7/2018 | Wang ..................... B81B 3/001 |

FOREIGN PATENT DOCUMENTS

| | | |
|---|---|---|
| DE | 102014100722 A1 | 7/2014 |
| DE | 102014212340 A1 | 1/2015 |

* cited by examiner

MICROELECTROMECHANICAL MICROPHONE

This application claims the benefit of German Application No. 102017118857.6, filed on Aug. 18, 2017, which application is hereby incorporated herein by reference in its entirety.

TECHNICAL FIELD

Numerous embodiments relate generally to a microelectromechanical microphone and to a method for producing a microelectromechanical microphone.

BACKGROUND

Microelectromechanical microphones play a very important part in modern communication. They generally comprise a membrane displaceable by sound to be detected, the displacement of which membrane contains information about characteristics of the sound to be detected, such as, for instance, sound frequency or sound amplitude. The displacement of a membrane of a microelectromechanical microphone of this type can be read out capacitively, for example, wherein the membrane together with a reference electrode forms a capacitor, the capacitance of which changes as a result of a displacement of the membrane. A voltage or/and current change caused by a capacitance change of this type can be measured by a suitable read-out circuit, as a result of which characteristics of the sound to be detected are determinable.

During the production of microelectromechanical microphones, a major challenge generally consists in producing the reference electrode with a well-defined shape in order to be able to ensure a reproducible behavior. A major problem here results from mechanical stresses to which the reference electrode may be subjected and which can adversely affect a reproducible behavior. Said mechanical stresses may have intrinsic causes and be attributable to thermal or mechanical loads during the production process. Alternatively or additionally, mechanical stresses of this type may be attributable to mutually different coefficients of thermal expansion of different components of a microelectromechanical microphone, which may be transferred to the reference electrode.

SUMMARY

In accordance with one exemplary embodiment, a microelectromechanical microphone is provided, which can comprise a holder and a sound detection unit carried on the holder. The sound detection unit can comprise: a planar first membrane, a planar second membrane arranged at a distance from the first membrane, wherein at least one from the first membrane or the second membrane is formed at least partly from an electrically conductive material, a low-pressure chamber formed between the first membrane and the second membrane, a reduced gas pressure relative to normal pressure being present in said low-pressure chamber, a reference electrode arranged at least in sections in the low-pressure chamber, said reference electrode being formed at least in sections from an electrically conductive material, wherein the first and second membranes are displaceable relative to the reference electrode by sound waves to be detected, wherein the reference electrode comprises a planar base section and also a stiffening structure provided on the base section, said stiffening structure being provided on a side of the base section that faces the first membrane or/and on a side of the base section that faces the second membrane.

In accordance with one exemplary embodiment, a method for producing a microelectromechanical microphone is provided, which microelectromechanical microphone can comprise a holder and a sound detection unit carried on the holder. The sound detection unit can comprise: a planar first membrane, a planar second membrane arranged at a distance from the first membrane, wherein at least one of the first membrane or the second membrane is formed at least partly from an electrically conductive material, a low-pressure chamber formed between the first membrane and the second membrane, a reduced gas pressure relative to normal pressure being present in said low-pressure chamber, a reference electrode arranged at least in sections in the low-pressure chamber, said reference electrode being formed at least in sections from an electrically conductive material, wherein the first and second membranes are displaceable relative to the reference electrode by sound waves to be detected, wherein the reference electrode comprises a planar base section and also a stiffening structure provided on the base section, said stiffening structure being provided on a side of the base section that faces the first membrane or/and on a side of the base section that faces the second membrane. The method can comprise: forming the first membrane on a substrate, depositing a first sacrificial material layer onto the first membrane, forming the reference electrode on the first sacrificial material layer, depositing a second sacrificial material layer onto the reference electrode, forming the second membrane on the second sacrificial material layer, removing a part of the first sacrificial material layer and of the second sacrificial material layer in order to form a chamber between the first membrane and the second membrane, producing a reduced gas pressure relative to normal pressure in the chamber and thereby forming the low-pressure chamber, closing the low-pressure chamber, and removing a part of the substrate in order to form the holder.

In accordance with a further exemplary embodiment, a method for producing a microelectromechanical microphone having a holder and a sound detection unit includes forming a first membrane of the sound detection unit on a substrate; depositing a first sacrificial material layer onto the first membrane; forming a reference electrode of the sound detection unit on the first sacrificial material layer; depositing a second sacrificial material layer onto the reference electrode; forming a second membrane of the sound detection unit on the second sacrificial material layer; removing a part of the first sacrificial material layer and of the second sacrificial material layer to form a chamber between the first membrane and the second membrane; producing a reduced gas pressure relative to normal pressure in the chamber, thereby forming a low-pressure chamber of the sound detection unit; closing the low-pressure chamber; and removing a part of the substrate to form the holder.

BRIEF DESCRIPTION OF THE DRAWINGS

Various embodiments will be described below by reference to the accompanying drawings, in which.

DETAILED DESCRIPTION OF ILLUSTRATIVE EMBODIMENTS

Figure 1:
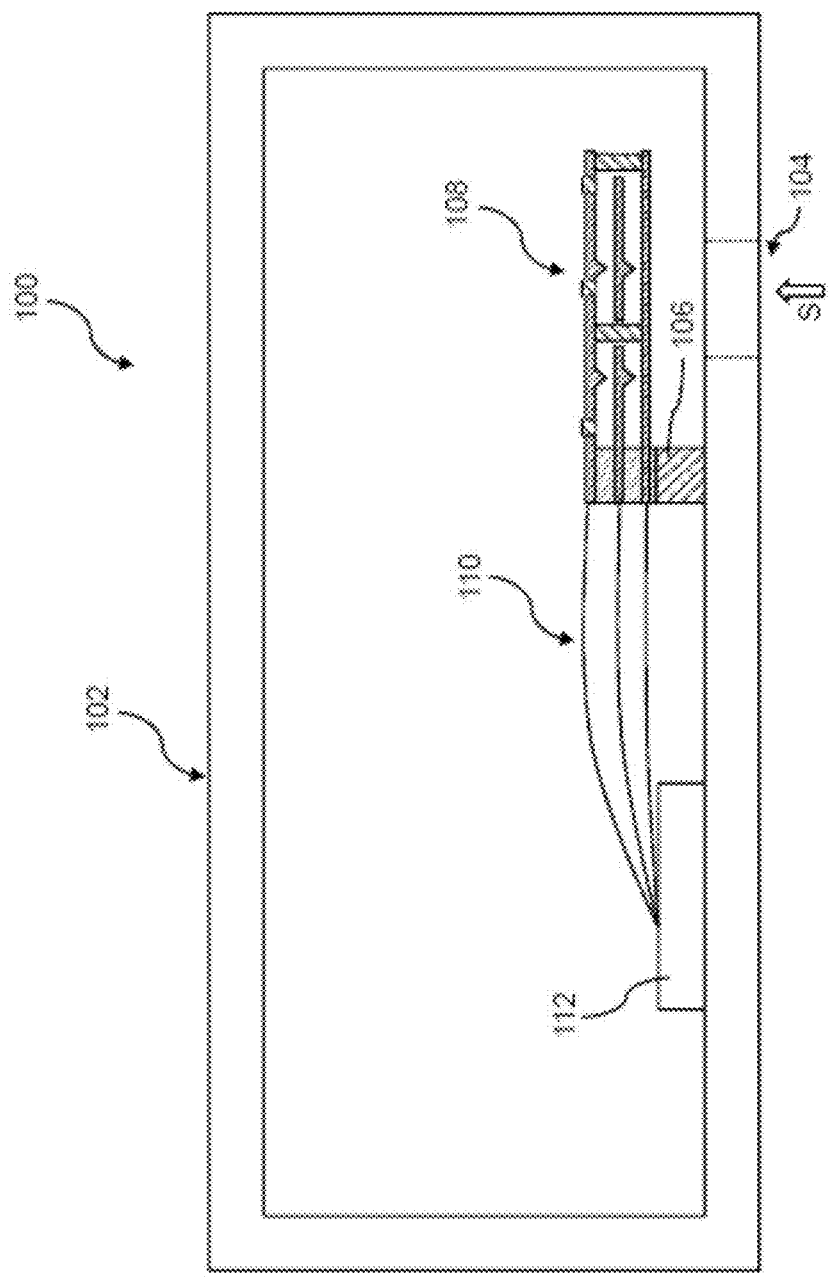
FIG. 1 shows a schematic illustration of one exemplary microelectromechanical microphone.

The term "exemplary" is used here to mean "serving as an example, as an exemplar or for illustration". Any embodiment or configuration described here as "exemplary" should not necessarily be understood as preferred or advantageous vis-à-vis other embodiments or configurations.

The term "planar" in the present application denotes the geometry of a component which has a significantly larger extent along a first spatial direction and a second spatial direction, orthogonal to the first spatial direction, compared with a third spatial direction, orthogonal to the first and second spatial directions. The third spatial direction may also be designated as a thickness direction of the component.

In the drawings, identical reference signs refer to the same parts in the different views. The drawings serve primarily to illustrate the essential principles of the present disclosure and are therefore not necessarily true to scale.

FIG. 1 schematically illustrates one exemplary microelectromechanical microphone 100. The latter can comprise a housing 102 having a sound entry opening 104, in the interior of which is arranged a sound detection unit 108 carried on a holder 106. Sound waves S to be detected can enter the interior of the housing 102 through the sound entry opening 104. As indicated in FIG. 1, the sound detection unit 108 overlaps the sound entry opening 104, such that sound waves S entering the interior of the housing 102 through the sound entry opening 104 can impinge directly on the sound detection unit 108. The sound detection unit 108 can be configured to convert characteristics of the sound waves S to be detected, such as, for instance, a sound frequency or a sound pressure, into electrical signals and to communicate the latter via signal lines 110 to a control unit 112. The control unit 112 can evaluate the electrical signals obtained from the sound detection unit 108 and determine from them characteristics of the sound waves S to be detected. The control unit 112 can also be configured to control or regulate operation of the sound detection unit 108, which will be discussed in detail below. The control unit 112 can comprise for example a microprocessor or/and an application specific integrated circuit (ASIC) or/and a field programmable gate array (FPGA). The microphone can be incorporated for example in a mobile communication device, such as, for instance, a cellular phone, a laptop or a tablet.

Figure 2:
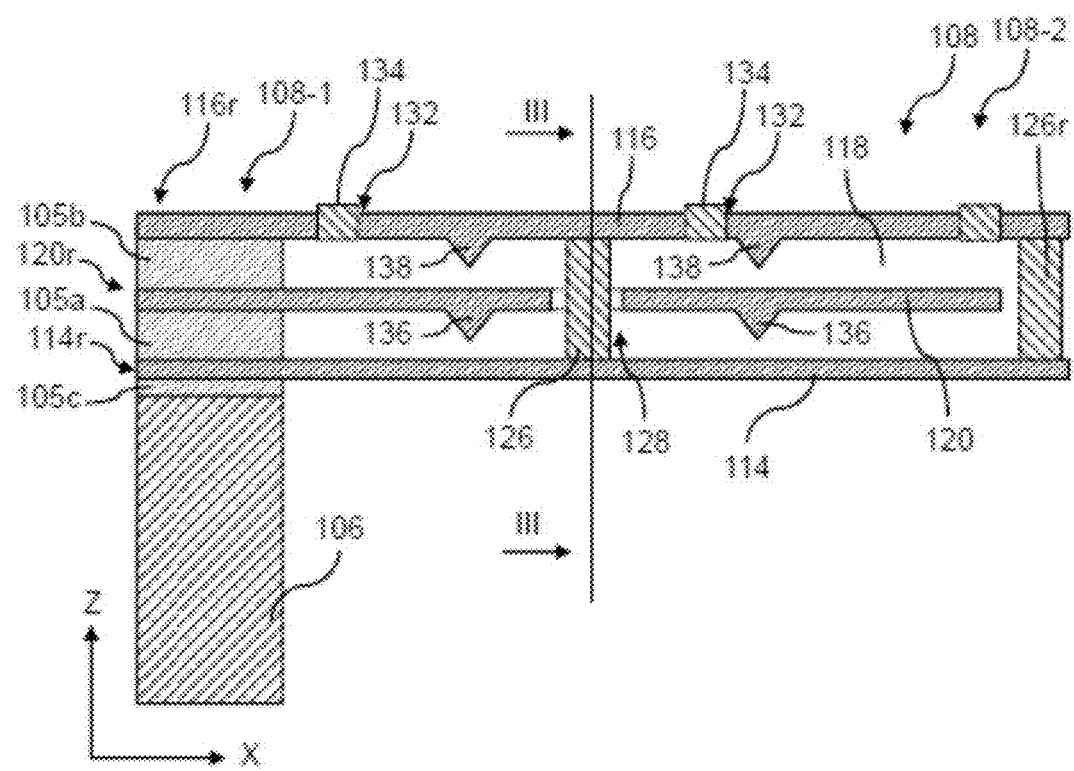
FIGS. 2-5 show simplified sectional views of sound detection units of a microelectromechanical microphone in accordance with various embodiments.
Figure 3:
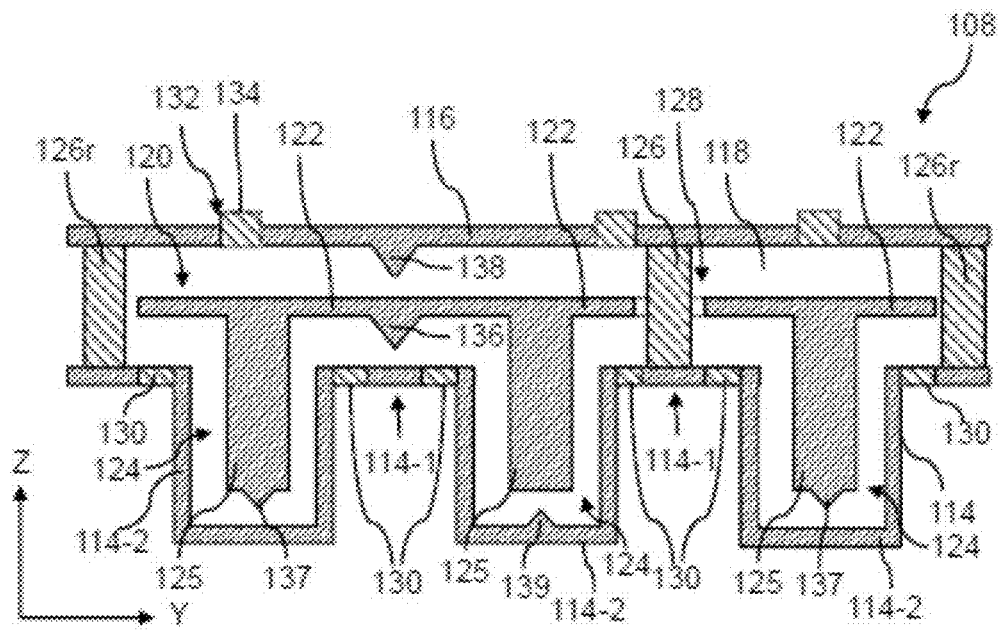

The sound detection unit 108 shown in FIG. 1 is illustrated in a simplified sectional illustration in FIG. 2 (X-Z-plane). Just a sectional area of the sound detection unit 108 can be seen here. FIG. 3 is a sectional illustration of the sound detection unit shown in FIG. 2 along the line III-III shown in FIG. 2 (Y-Z-plane).

As indicated in FIG. 2, the sound detection unit 108 is carried on the holder 106. The sound detection unit 108 can comprise: a planar first membrane 114, a planar second membrane 116 arranged at a distance from the first membrane 114, wherein the first membrane 114 or/and the second membrane 116 is/are formed at least partly from an electrically conductive material, a low-pressure chamber 118 formed between the first membrane 114 and the second membrane 116, a lower gas pressure relative to normal pressure (1013.25 mbar) being present in said low-pressure chamber, and also a reference electrode 120 arranged at least in sections in the low-pressure chamber 118 and formed at least in sections or completely from an electrically conductive material, wherein the first and second membranes 114, 116 are displaceable relative to the reference electrode 120 by sound waves to be detected. The reference electrode 120 can comprise a planar base section 122 and also a stiffening structure 124 provided on the base section 122, said stiffening structure being provided on a side of the base section 122 that faces the first membrane 114. Although not shown in the figures, the stiffening structure can, of course, also be provided on a side of the base section 122 that faces the second membrane 116, or alternatively be provided only on a side of the base section 122 that faces the second membrane 116.

Providing the stiffening structure 124 makes it possible for the reference electrode 120 to be provided with a high flexural stiffness, without said reference electrode having to be provided throughout with a large thickness, for example of more than 10 µm, since such a large thickness can possibly lead to stress gradients that can in turn result in a deformation of the reference electrode 120. It is thus possible to provide the reference electrode 120 with a well-defined geometry, as a result of which it is possible to ensure a well-defined distance between the reference electrode 120 and the first membrane 114 and/or the second membrane 116.

The stiffening structure 124 can comprise at least one stiffening rib 125 protruding from the base section 122, or even, as shown in FIG. 3, a plurality of stiffening ribs 125 protruding from the base section 122. As a result, it is possible to provide the stiffening structure 124 with a simple construction. Moreover, the alignment of the stiffening ribs 125 can be adapted to the construction of the sound detection unit 108, and in particular to the precise securing of the sound detection unit 108 to the holder 106. In the case of the sound detection unit 108 shown in FIGS. 2 and 3, the stiffening ribs 125 can be arranged substantially parallel to one another.

In one exemplary embodiment which is not shown in the figures, the sound detection unit 108 can be fixed to the holder 106 substantially at the entire edge of said sound detection unit. In the case of such a construction, it is possible to provide stiffening ribs extending substantially in a radial or diagonal direction.

Alternatively, the sound detection unit 108, as shown in FIGS. 2 and 3, can comprise a first edge section 108-1, which is fixed to the holder 106, and a second edge section 108-2, which is situated opposite the first edge section 108-1 and which is not fixed to the holder 106 and at which the first and second membranes 114, 116 are displaceable relative to the reference electrode 120 by sound waves to be detected.

The construction shown in FIGS. 2 and 3 affords a very simple possibility for compensating for intrinsic mechanical stresses in the reference electrode 120 and in the membranes 114, 116 by allowing the second edge region 108-2 of the sound detection unit 108 to assume a neutral position. Said neutral position can be maintained by the reference electrode 120 by virtue of the stiffening ribs extending between the first and second edge regions 108-1, 108-2 of the sound detection unit 108, independently of arriving sound waves, since, by virtue of this configuration, the stiffening ribs 125 can counteract a flexure of the reference electrode 120 around an edge section 120r fixed to the holder 106. Consequently, the first and second membranes 114, 116 can be displaced by sound at the second edge section 108-2 of the sound detection unit 108 relative to a reference electrode 120 held in a well-defined position. A reproducible microphone response can be ensured as a result. Moreover, the first and second membranes 114, 116 have a high compliance on account of their being secured only on one side, which high compliance can contribute to a high sensitivity.

As evident from FIGS. 2 and 3, the stiffening ribs 125 are arranged successively in a Y-direction, and extend in each case in an X-direction. The Z-direction indicated in these Figures can be parallel to a thickness direction of the sound detection unit 108. The stiffening ribs 125 can extend substantially rectilinearly from the first edge section 108-1 of the sound detection unit 108 to the second edge section 108-2 of the sound detection unit 108, as a result of which a very simple overall construction can be provided.

The base section 122 can be configured as a single layer, which can be formed from an electrically conductive material. The stiffening ribs 125 of the stiffening structure 124 can be formed from the same material as the base section 122 and can even be configured integrally with the base section 122.

The first and second membranes 114, 116 and also the reference electrode 120 can be carried at their respective edge sections 114r, 116r, 120r on the holder 106 by interposition of respective supporting elements 105a-c. As indicated in FIG. 2, an electrically insulating supporting element 105a can be arranged between the first membrane 114 and the reference electrode 120. An electrically insulating supporting element 105b can be arranged between the reference electrode 120 and the second membrane 116, and a further electrically insulating supporting element 105c can be arranged between the first membrane 114 and the holder 106.

An electrically conductive material can be a material having an electrical conductivity of more than 10 S/m, for example more than $10^2$ S/m or more than $10^4$ S/m or even more than $10^6$ S/m. An electrically insulating material can be a material having an electrical conductivity of less than $10^2$ S/m, for example less than $10^5$ S/m or even less than $10^8$ S/m.

The electrically conductive material from which the first membrane 114 or/and the second membrane 116 or/and the reference electrode 120 is/are formed at least in sections can be for example a polycrystalline semiconductor material, such as, for instance, polycrystalline silicon, or a metal. The supporting elements 105a-c can be formed from an electrically insulating material, for example $SiO_x$ or/and $Si_xN_y$. The holder 106 can be produced for example from a crystalline semiconductor material, for instance silicon.

The first membrane 114, the second membrane 116 and the reference electrode 120 can have diameters of less than 2 mm, optionally less than 1.5 mm, further optionally less than 1 mm, for example less than 750 µm or even less than 500 µm.

The sound detection unit 108 can be read for example capacitively by the control unit 112, for example by a first electrical signal being determined and respectively read out, said first electrical signal representing a change—caused by sound—in a capacitance between the first membrane 114 and the reference electrode 120, or/and for example by a second electrical signal being determined and respectively read out, said second electrical signal representing a change—caused by sound—in a second capacitance between the second membrane 116 and the reference electrode 120, by means of the control unit 112.

The base section 122 of the reference electrode 120, as shown in FIGS. 2 and 3, can be configured as a single layer formed from a uniform material in a thickness direction. The first membrane 114 and the second membrane 116 can each be formed from an electrically conductive material and be electrically insulated from one another. This construction affords the possibility, for example with driving by the control unit 112, of a uniform reference voltage being applied to the reference electrode 120, while mutually different operating voltages can be applied to the first and second membranes 114, 116, for example operating voltages having, with respect to the reference voltage, the same magnitude but opposite signs. As a result, two mutually different electrical signals can be determined, which can be combined with one another by addition or subtraction in order to reduce or to eliminate common noise contributions. Consequently, with this construction it is possible to realize a differential measurement scheme that enables a precise measurement or determination of properties of the sound to be detected, such as, for instance, sound frequency or/and sound pressure.

An electrical insulation between the first membrane 114 and the second membrane 116 can be provided firstly by the abovementioned supporting elements 105a and 105b and secondly by at least one spacer 126 or a plurality of spacers 126 arranged in a region of the first and second membranes 114, 116 that is respectively different than the edge section 114r of the first membrane 114 and than the edge section 116r of the second membrane 116. The spacer 126 or the spacers 126 can be formed for example from $SiO_x$ or $Si_xN_y$.

The spacer(s) 126 can be in permanent physical contact with the first membrane 114 and/or the second membrane 116. The reference electrode 120 in assignment to at least one spacer 126 can comprise a through opening 128 which extends continuously in the thickness direction and through which a spacer 126 extends. At least one spacer 126 or a plurality of the spacers 126 can extend through a respective through opening 128 without contact, that is to say without touching the reference electrode 120, optionally independently of the respective positions of the first membrane 114 or/and of the second membrane 116 relative to the reference electrode 120. As a result, it is possible to prevent an interaction between the spacer 126 or the spacers 126 and the reference electrode 120, as a result of which it is possible to ensure a displacement of the first or/and of the second membrane 114, 116 relative to the reference electrode 120, which displacement is substantially free of interaction with regard to the reference electrode 120, which can contribute for example to a high degree of linearity of the response of the sound detection unit 108 or of the microelectromechanical microphone 100.

Providing the spacers 126 extending through the through openings 128 makes it possible to provide a close-meshed spacer arrangement that can be used to set the distance between the first membrane 114 and the second membrane 116 accurately over the entire extent of the first and second membranes 114, 116. Likewise, a defined position of the first and second membranes 114, 116 relative to the reference electrode 120 can be ensured by means of the spacer 126 or by means of the spacers 126. The distances between adjacent spacers 126 can be approximately 10-100 µm, optionally 25-75 µm, further optionally 40-60 µm.

The diameter of a spacer 126 can be approximately 0.5-5 µm. The diameter of a through opening 128 can be 10% to 300%, optionally 50% to 200%, further optionally 100% to 150%, greater than the diameter of a spacer 126 extending through the relevant through opening 128. The above relations can apply, of course, to a plurality of through openings 128 or even to all through openings 128 and the spacers 126 extending through them. These diameters make it possible to limit a gas or air flow through the through openings 128 in the case of a displacement of the first and second membranes 114, 116 relative to the reference electrode 120, which can in turn limit the electrical noise contributions caused by the gas or air flow.

The noise contributions caused by a gas or air flow through the through openings 128 can additionally be reduced by virtue of the fact that, as noted above, a reduced gas pressure relative to normal pressure is present in the low-pressure chamber 118. The gas pressure in the low-pressure chamber 118 can be less than 100 mbar, optionally less than 50 mbar, further optionally less than 10 mbar. Given such a gas pressure it is possible, moreover, to reduce the resistance which is caused by gas, for instance air, in the low-pressure chamber 118 and which counteracts a movement of the membranes 114, 116 relative to the reference electrode 120, as a result of which a high compliance of the first membrane 114 and of the second membrane 116 relative to the reference electrode 120 is made possible. A high detection sensitivity can be achieved as a result.

As indicated in FIGS. 2 and 3, the low-pressure chamber 118 can be sealed toward the outside in the X direction or Y direction in part by boundary walls 126r, which likewise function as spacers and can ensure a predefined distance between the first membrane 114 and the second membrane 116 in an edge region of the low-pressure chamber 118. Hence they do not extend through a through opening in the reference electrode 120.

As evident in FIG. 3, the first membrane 114 can have at least in sections a shape that is complementary to the reference electrode 120. In this case, it is possible to ensure in particular a small distance between the first membrane 114 and the base section 122 of the reference electrode 120, as a result of which it is possible to provide a high capacitance between the base section 122 and that region 114 1 of the first membrane 114 which is situated directly opposite the base section 122.

Since, in the case of the configuration shown in FIG. 3, that region 114-2 of the first membrane 114 which is situated directly opposite the stiffening structure 124 together with the stiffening structure 124 can define a parasitic capacitance provision can be made for that region 114-1 of the first membrane 114 which is situated directly opposite the base section 122 to be electrically insulated from that region 114-2 of the first membrane 114 which is situated directly opposite the stiffening structure 124. Such a segmentation of the first membrane 114 can be achieved for example by means of a plurality of electrically insulating elements 130 that are shown in FIG. 3. Said elements can be formed from $SiO_x$ or $SixN_y$, for example. Optionally, the second membrane 116 can also be segmented into a plurality of sections that are electrically insulated from one another in accordance with the stiffening structure 124.

This configuration allows a measurement of an electrical signal caused by a change in a capacitance between the reference electrode 120 and only that region 114-1 of the first membrane 114 which is situated opposite the base section 122. That means that the influence of the parasitic capacitance between the stiffening structure 124 and that region 114-2 of the first membrane 114 which is situated opposite the stiffening structure 124 can be eliminated as a result.

As shown in FIGS. 2 and 3, at least one through opening 132 or a plurality of through openings 132 closed by one or respectively a plurality of closure elements 134 can be provided at the second membrane 116. The through openings 132 can have production-dictated causes and be used for example as ventilation openings in order to produce a reduced gas pressure relative to normal pressure in the low-pressure chamber 118. Afterward, the through openings 132 can be closed by the closure elements 134 shown in FIGS. 2 and 3 in order to maintain the lower gas pressure relative to normal pressure in the low-pressure chamber 118. The closure elements 134 can be formed for example from an electrically insulating material, such as, for instance, $SiO_x$ or $SixN_y$.

In order, during a sound-dictated deflection of the first membrane 114 and of the second membrane 116 relative to the reference electrode 120, to be able to avoid a large-area contact between the first membrane 114 or the second membrane 116, on the one hand, and the reference electrode 120, on the other hand, or sticking of the first membrane 114 to the reference electrode 120 and/or of the second membrane 116 to the reference electrode 120, the reference electrode 120 can comprise at least one reference electrode anti-stick projection 136, 137, optionally a plurality of reference electrode anti-stick projections 136, 137, at a surface facing the first membrane 114 or/and at a surface facing the second membrane 116. Alternatively or additionally, the first membrane 114 or/and the second membrane 116 can comprise at least one membrane anti-stick projection 138, 139, optionally a plurality of membrane anti-stick projections 138, 139, at a surface facing the reference electrode 120. In the case of the sound detection unit 108 shown in FIGS. 2 and 3, the base section 122 of the reference electrode 120 comprises a plurality of reference electrode anti-stick projections 136 at a surface facing the first membrane 114. Furthermore, at least one reference electrode anti-stick projection 137 or a plurality of reference electrode anti-stick projections 137 can be provided at a surface of the stiffening structure 124 that faces the first membrane 114. As shown in FIG. 3, at least one stiffening rib 125 or a plurality of stiffening ribs 125 can be provided with a or a respective reference electrode anti-stick projection 137 at a surface facing the first membrane 114. As shown in FIGS. 2 and 3, the reference electrode anti-stick projections 136, 137 can have a shape tapering in the direction of the first membrane 114 in order, in the case of an actual physical contact between the first membrane 114 and the reference electrode 120, to minimize a contact area between the first membrane 114 and the reference electrode 120. Furthermore, the second membrane 116 comprises a plurality of membrane anti-stick projections 138 at a surface facing the reference electrode 120. The first membrane 114, too, can comprise at least one membrane anti-stick projection 139 facing the reference electrode 120. Said projection can be provided for example in a region of the first membrane 114 which is situated opposite a stiffening rib 125. As shown in FIGS. 2 and 3, the membrane anti-stick projections 138, 139 can have a shape tapering in the direction of the reference electrode 120.

In order to be able to prevent an electrical short circuit in the case of an actual physical contact between the membranes 114, 116 and the reference electrode 120, the reference electrode anti-stick projections 136, 137 or/and the membrane anti-stick projections 138, 139 can be formed at least partly or completely from an electrically insulating material. Alternatively or additionally, the regions of the first or/and of the second membrane 114, 116 that are situated opposite the reference electrode anti-stick projections 136, 137 can be coated with an electrically insulating material. Alternatively or additionally, the regions of the reference electrode 120 that are situated opposite the membrane anti-stick projections 138, 139 can be coated with an electrically insulating material. If the reference electrode anti-stick projections 136, 137 or/and the membrane anti-stick projections 138, 139 have a tapering shape, in one exemplary embodiment just the tips thereof can be formed from an electrically insulating material.

A sound detection unit that is modified by comparison with the sound detection unit 108 shown in FIGS. 2 and 3 will be described below by reference to FIG. 4. In this case, components and component sections identical and functionally identical to those in FIGS. 2 and 3 will be provided with the same reference signs as in FIGS. 2 and 3, but increased by the number 100. In this case, the sound detection unit 208 shown in FIG. 4 will be described only insofar as it differs from the sound detection unit 108 shown in FIGS. 2 and 3, to the description of which, for the rest, reference is expressly made.

Figure 4:
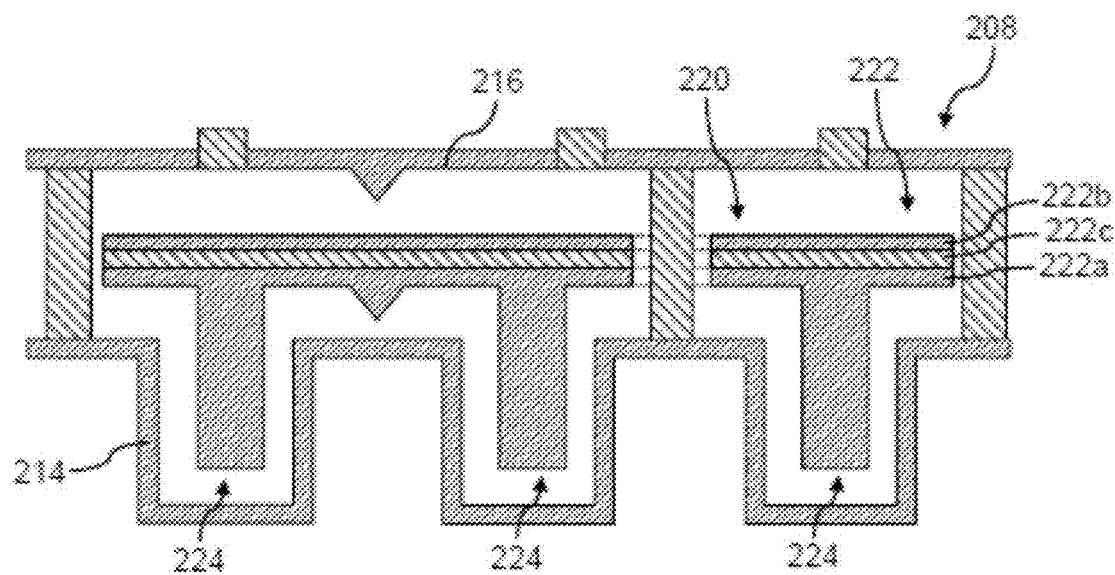

The sound detection unit 208 shown in FIG. 4 differs from the sound detection unit 108 shown in FIGS. 2 and 3 with regard to the configuration of the reference electrode 220 and also the first membrane 214. In contrast to the sound detection unit 108 shown in FIGS. 2 and 3, the base section 222 of the reference electrode 220 is not configured as a single layer, but rather comprises a first electrode 222a facing the first membrane 214, a second electrode 222b facing the second membrane 216, and also an electrically insulating layer 222c arranged between the first electrode 222a and the second electrode 222b. In the case of this configuration, by way of example, in order to determine characteristics of sound waves to be detected, it is possible to acquire just electrical signals that are caused by a change in a capacitance between the second electrode 222b of the base section 222 and the second membrane 216. A measurement signal which is substantially uninfluenced by parasitic capacitances between the stiffening structure 224 and the first membrane 214 can be provided as a result. Consequently, the segmentation of the first membrane 214 as discussed in association with FIGS. 2 and 3 can be omitted, as a result of which ultimately a simplified construction overall can be provided.

The first electrode 222a of the base section 222 can be used in cooperation with the first membrane 214 to put the first membrane 214 and the second membrane 216 into a defined initial position relative to the reference electrode 220. For this purpose, the first membrane 214 and also the first electrode 222a of the base section 222 and the stiffening structure 224 configured integrally with the first electrode 222a can be used as an actuator unit by means of which, by applying a defined electrical voltage between the first electrode 222a and the first membrane 214, a defined distance between these components can be set electrostatically. As a result, deformations of the first membrane 214 or/and of the second membrane 216 that are caused by intrinsic mechanical stresses, for example, can be corrected electrostatically and the first and also the second membrane 216 can be put into a defined initial position relative to the reference electrode 120.

A further exemplary sound detection unit will be described below by reference to FIG. 5. In this case, components and component sections identical and functionally identical to those in FIGS. 2 and 3 will be provided with the same reference signs as in FIGS. 2 and 3, but increased by the number 200 relative to the sound detection unit 108 shown in FIGS. 2 and 3. In this case, the sound detection unit 308 shown in FIG. 5 will be described only insofar as it differs from the sound detection unit 108 shown in FIGS. 2 and 3, to the description of which, for the rest, reference is expressly made.

Figure 5:
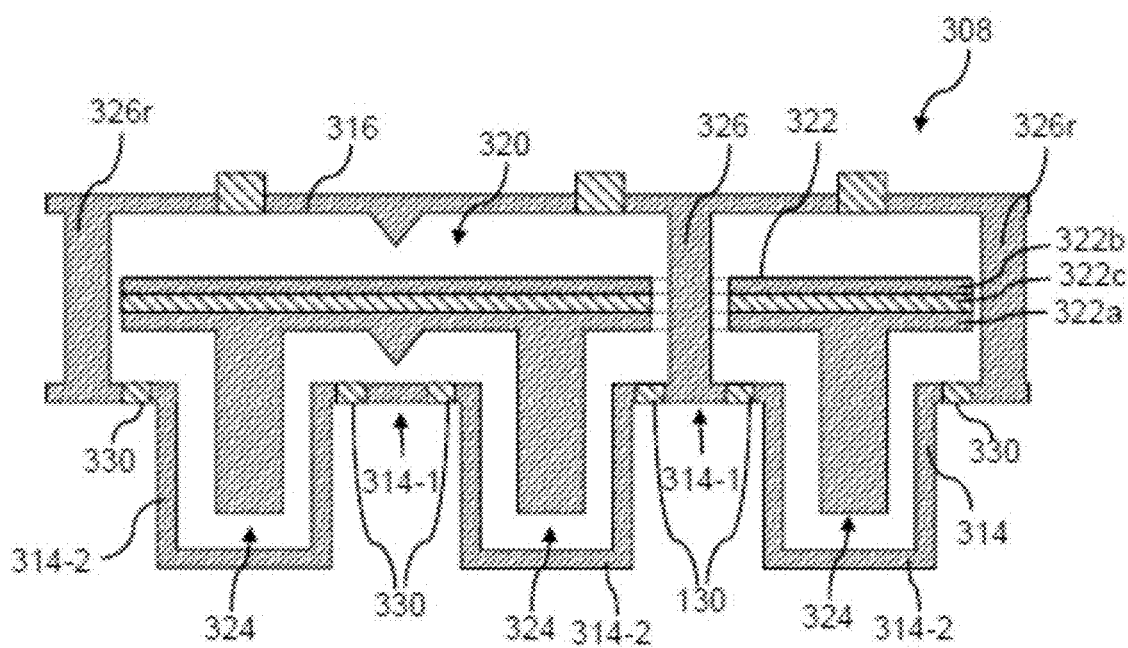

The sound detection unit 308 shown in FIG. 5 differs from the sound detection unit 108 shown in FIGS. 2 and 3 with regard to the configuration of the base section 322 of the reference electrode 320. The base section 322 is not configured as a single layer, but rather comprises a first electrode 322a facing the first membrane 314, a second electrode 322b facing the second membrane 316, and also an electrically insulating layer 322c arranged between the first electrode 322a and the second electrode 322b. The construction of the base section 322 of the sound detection unit 308 substantially corresponds to the base section 222 of the reference electrode 220 shown in FIG. 4. Therefore, reference is made here to the corresponding description of FIG. 4.

The sound detection unit 308 shown in FIG. 5 furthermore also differs from the sound detection unit 108 shown in FIGS. 2 and 3 with regard to the spacers 326 and 326r, which, in contrast to the sound detection unit 108, are not produced from an electrically insulating material, but rather from an electrically conductive material, and can thus produce an electrical connection between the first membrane 314 and the second membrane 316. As indicated in FIG. 5, the spacers 326, 326r can be configured integrally with the first membrane 314 or/and with the second membrane 316.

The first membrane 314 can be segmented in a manner similar to the sound detection unit 108 shown in FIGS. 2 and 3 and can comprise a region 314-1 situated directly opposite the base section 322, which region can be electrically connected to the second membrane 316. The region 314-1 can be electrically insulated from a region 314-2 of the first membrane 314 that is situated directly opposite the stiffening structure 324 by means of electrically insulating elements 330, for example. In this way, as ways explained in connection with the sound detection unit 108, the influence of parasitic capacitances between the first membrane 314 and the stiffening structure 324 can be eliminated or at least reduced.

During operation, a reference voltage can be applied to the second electrode 322b of the base section 322, while a uniform operating voltage can be applied to the region 314-1 of the first membrane 314 that is situated opposite the base section 322, and also to the second membrane 316. As a result, the area of the capacitor formed by the second electrode 320b, the second membrane 316 and also the region 314-1 of the first membrane 314 that is situated opposite the base section 322 can be increased, as a result of which an increase in sensitivity can be achieved.

One exemplary method for producing a sound detection unit of one exemplary microelectromechanical microphone will be described below by reference to FIGS. 6a to 18b. Figures having designations that differ merely in the suffix "a" or "b" show sectional views along mutually orthogonal planes of the sound detection unit at a specific point in time during the production thereof.

Figure 6A:
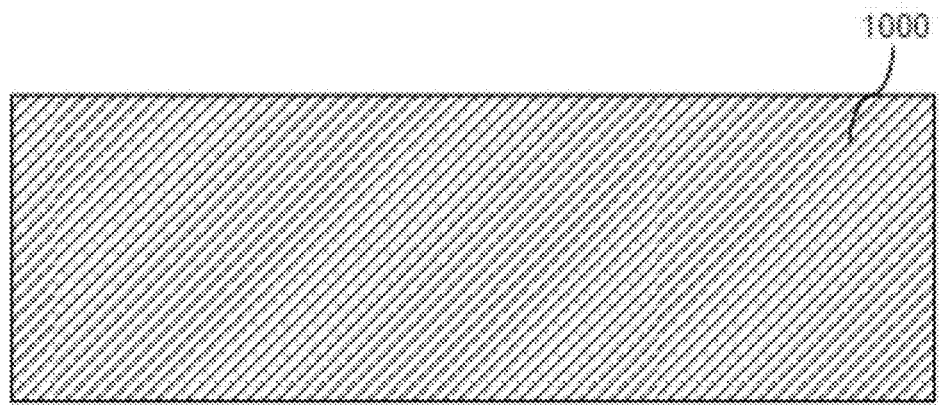
FIGS. 6a-18b show simplified sectional views which illustrate one exemplary method for producing a sound detection unit of one exemplary microelectromechanical microphone.
Figure 6B:
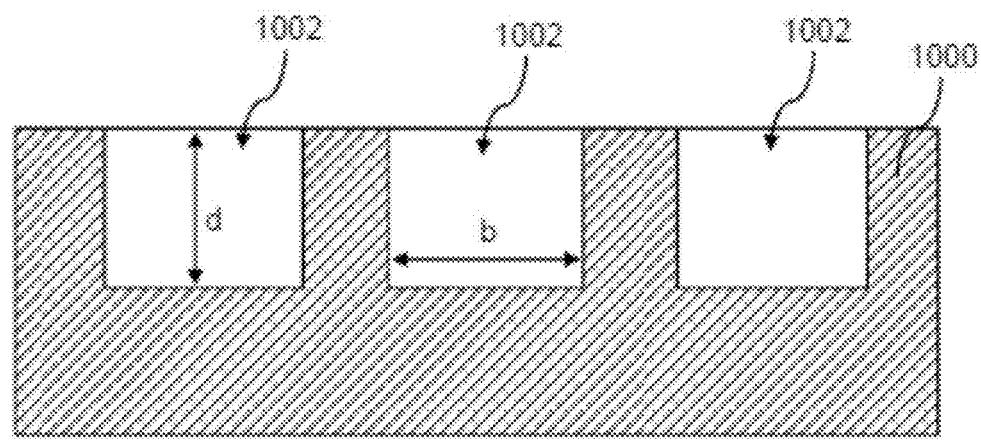

The method can comprise, as shown in FIG. 6b, forming a plurality of cutouts 1002 in a substrate 1000. The substrate 1000 can be formed for example from a monocrystalline semiconductor material, for instance from silicon. The cutouts 1002 can have for example a depth d of approximately 10-30 µm and a width b of approximately 10-30 µm. The cutouts can extend parallel to the sectional plane in FIG. 6a.

Figure 7A:
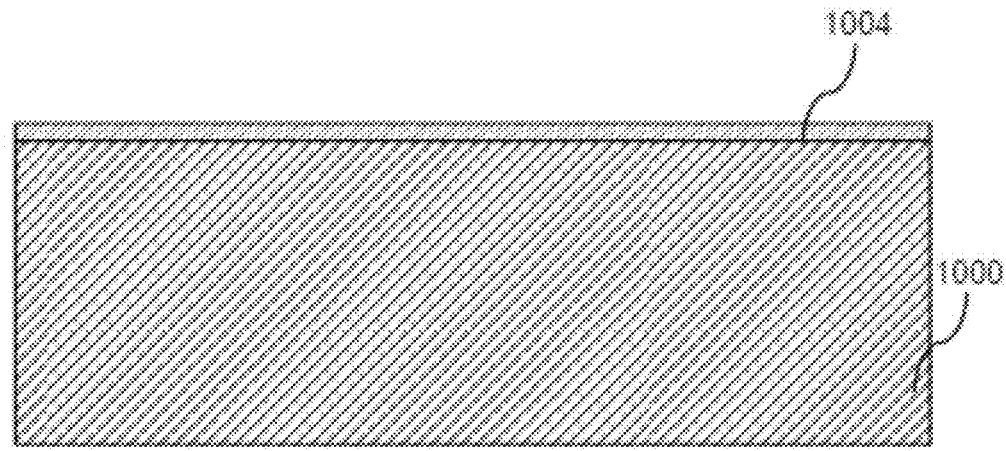
Figure 7B:
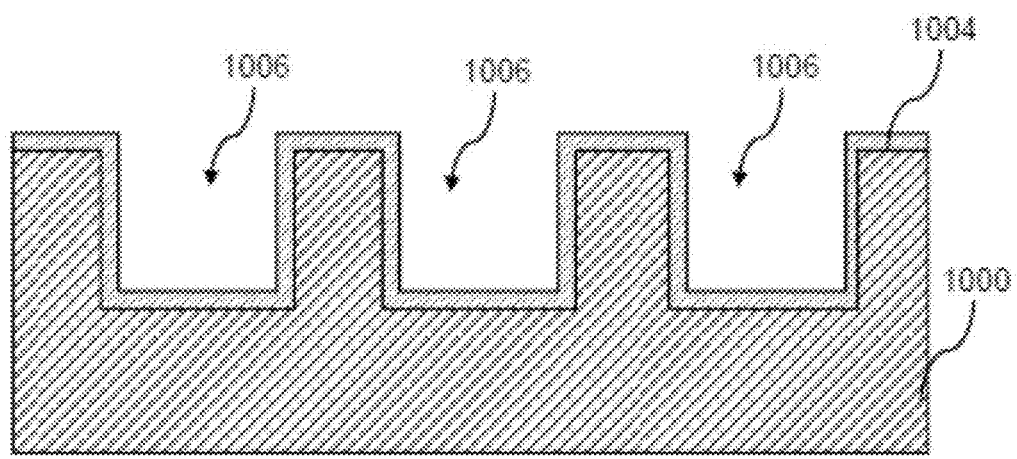

Afterward, as shown in FIGS. 7a and 7b, an electrically insulating layer 1004 having a thickness of approximately 100-500 nm can be applied on the substrate 1000. Said layer can be formed from an oxide, such as, for instance, from $SiO_x$. The electrically insulating layer 1004 can be applied with a substantially uniform thickness on the substrate 1000, such that even after the deposition of the layer 1004, cutouts 1006 are still provided at the substrate 1000, although they are now altered in terms of their dimensions compared with the original cutouts 1002 as a result of the electrically insulating layer 1004.

Figure 8A:
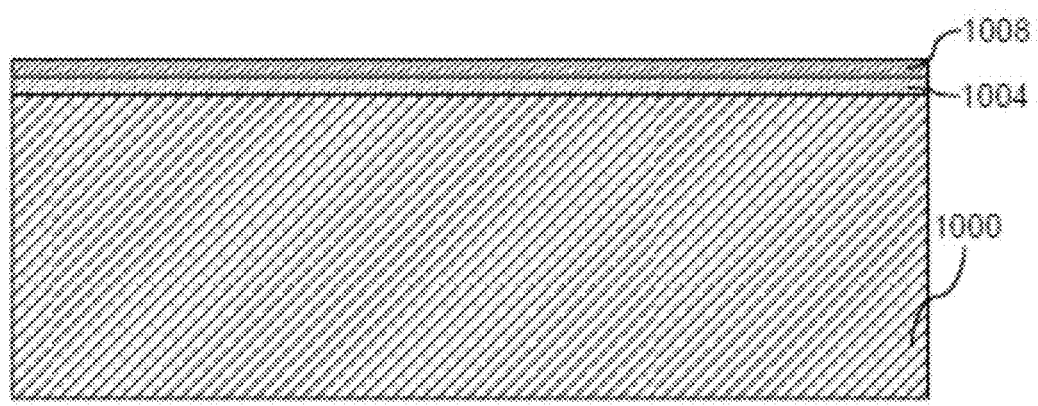
Figure 8B:
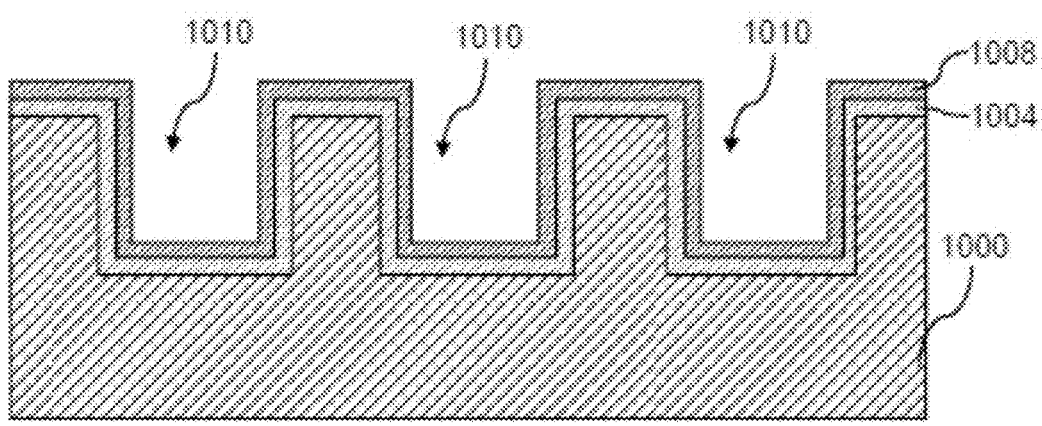

Afterward, as shown in FIGS. 8a and 8b, an electrically conductive layer 1008 can be applied on the electrically insulating layer 1004. The electrically conductive layer 1008 can be formed for example from a metal or from polycrystalline silicon. The electrically conductive layer 1008 corresponds to a first membrane of the sound detection unit to be produced. As shown in FIG. 8b, the electrically conductive layer 1008 can have a thickness such that cutouts 1010 are defined at a side of the electrically conductive layer 1008 that faces away from the substrate 1000, which cutouts merely have altered dimensions in comparison with the original cutouts 1002. The first membrane 1008 can have a thickness of a few 100 nm, for example approximately 500 nm.

Figure 9A:
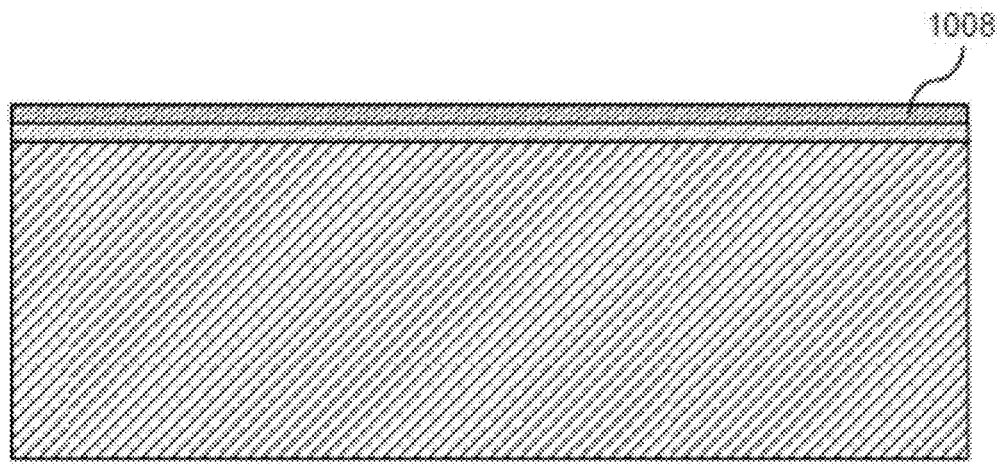
Figure 9B:
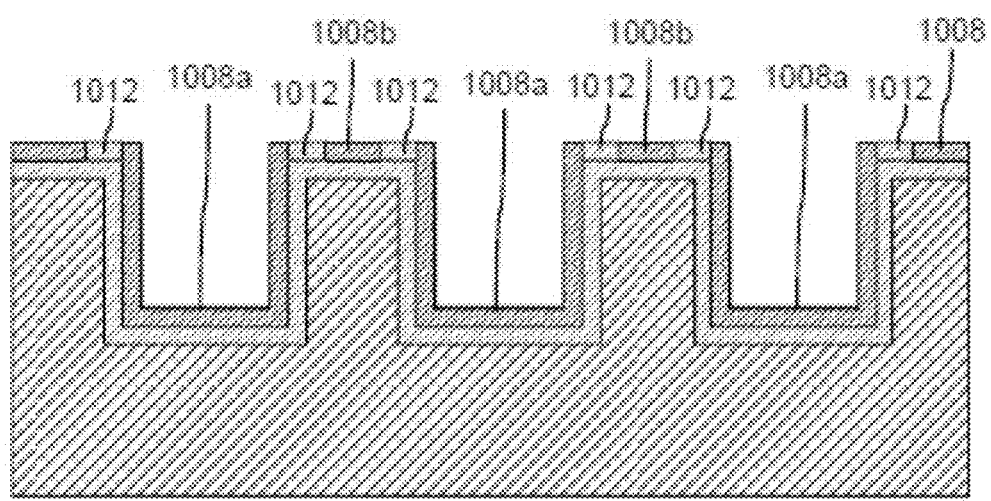

Afterward, as shown in FIG. 9b, the electrically conductive layer 1008 can be segmented into a plurality of sections 1008a, 1008b that are electrically insulated from one another by virtue of the fact that openings are formed at predefined positions in the electrically conductive layer 1008, said openings subsequently being filled by electrically insulating elements 1012. The electrically insulating elements 1012 can be formed from $Si_xN_y$, for example. The electrical segmentation of the electrically conductive layer 1008 is similar to the segmentation of the first membrane 114 of the sound detection unit 108 shown in FIGS. 2 and 3. Since FIG. 9a shows a sectional area that is substantially parallel to the cutouts 1010, neither the cutouts 1010 nor the electrically insulating elements 1012 are visible in FIG. 9a.

Figure 10A:
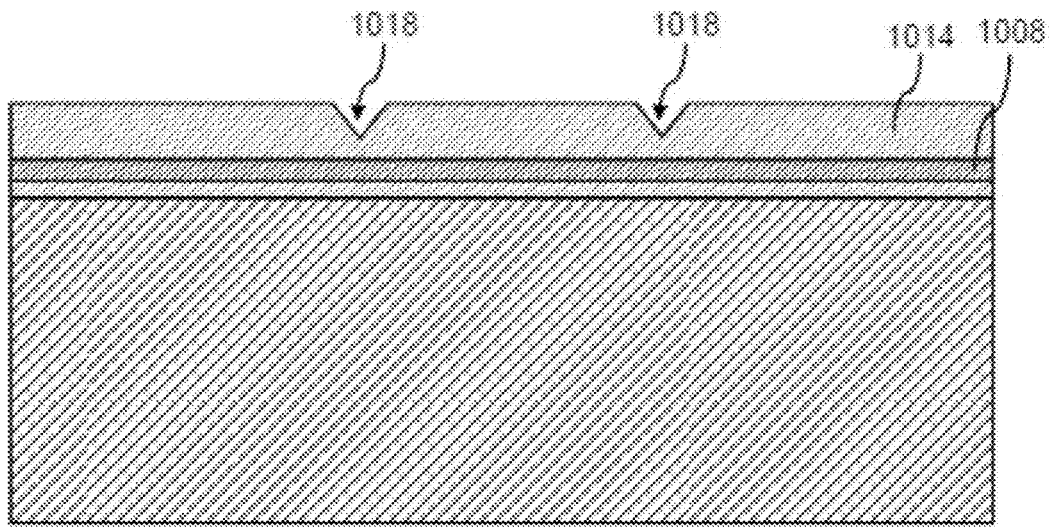
Figure 10B:
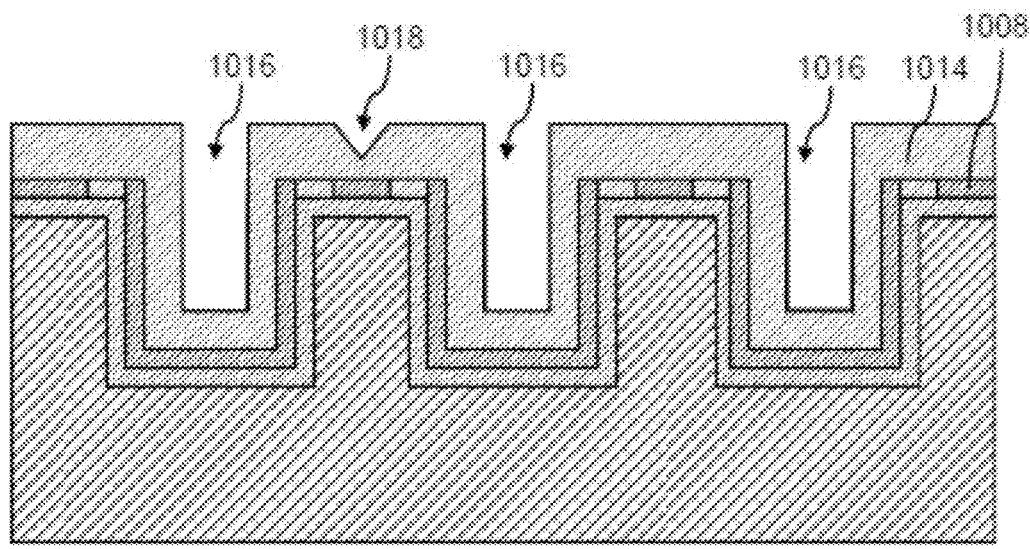

Afterward, as shown in FIGS. 10a and 10b, a first sacrificial material layer 1014 can be deposited onto the segmented first membrane 1008. The first sacrificial material layer 1014 can be formed for example from an oxide, such as, for instance, $SiO_x$. The first sacrificial material layer 1014 can be deposited onto the electrically conductive layer 1008, i.e. onto the first membrane 1008, with a thickness, for example approximately 2 µm, such that cutouts 1016 are formed at a side of the first sacrificial material layer 1014 that faces away from the first membrane 1008, which cutouts are arranged at the positions of the original cutouts 1002 and merely have smaller dimensions by comparison therewith. As will be shown below, the cutouts 1016 form a negative mold for a stiffening structure of a reference electrode that is subsequently to be formed on the first sacrificial material layer 1014. As furthermore shown in FIGS. 10a and 10b, a plurality of recesses 1018 tapering in the direction of the first membrane 1008 can furthermore be formed in the first sacrificial material layer 1014, which recesses can serve as negative molds for respective reference electrode anti-stick projections.

Figure 11A:
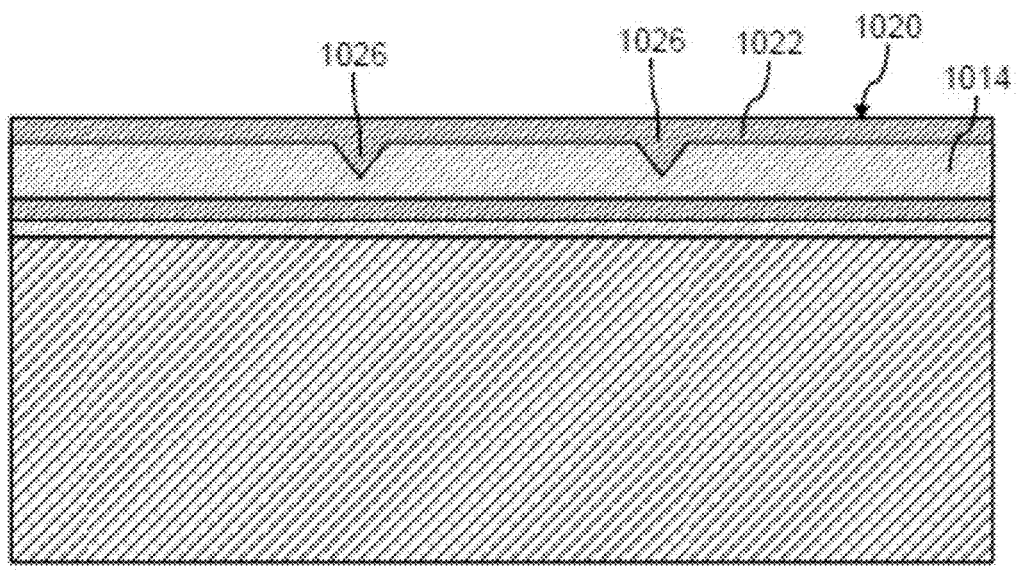
Figure 11B:
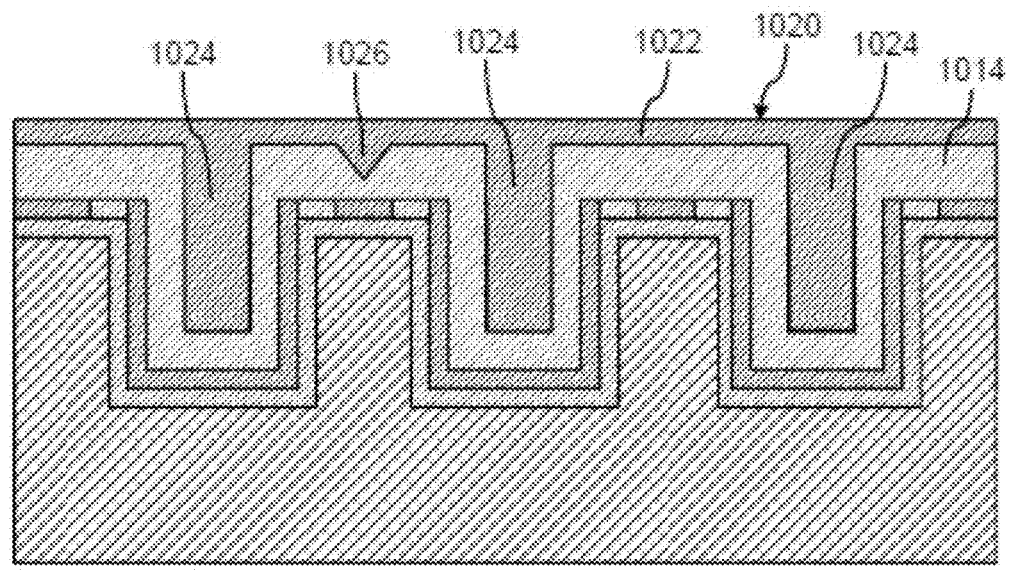

Afterward, as shown in FIGS. 11a and 11b, a reference electrode 1020 can be deposited onto the first sacrificial material layer 1014, said reference electrode completely covering the first sacrificial material layer 1014 and completely filling the cutouts 1016 and recesses 1018. As noted above, the cutouts 1016 and recesses 1018 serve as a negative mold for a stiffening structure 1024 of the reference electrode 1020, which additionally comprises a base section 1022 configured as a single layer. Said base section thus corresponds, with regard to its construction, to the base section 122 shown in FIGS. 2 and 3. As furthermore shown in FIGS. 11a and 11b, by depositing the reference electrode 1020 onto the first sacrificial material layer 1014, the tapering recesses 1018 formed in the first sacrificial material layer 1014 are also filled, as a result of which respective reference electrode anti-stick projections 1026 are formed. The reference electrode 1020 can be formed from an electrically conductive material such as, for instance, a metal or a polycrystalline semiconductor material.

Figure 12A:
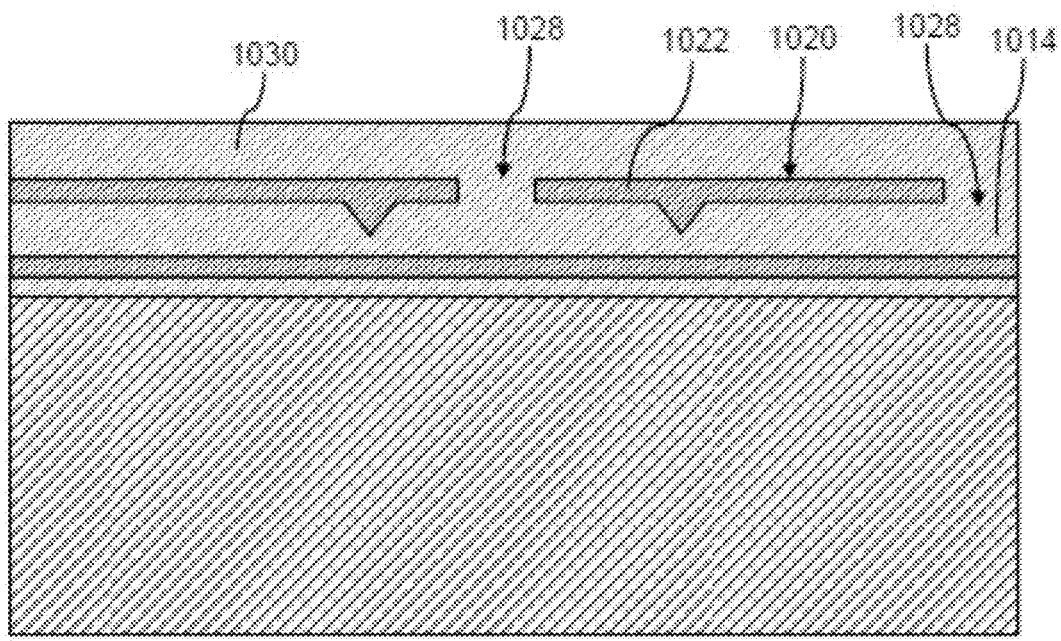
Figure 12B:
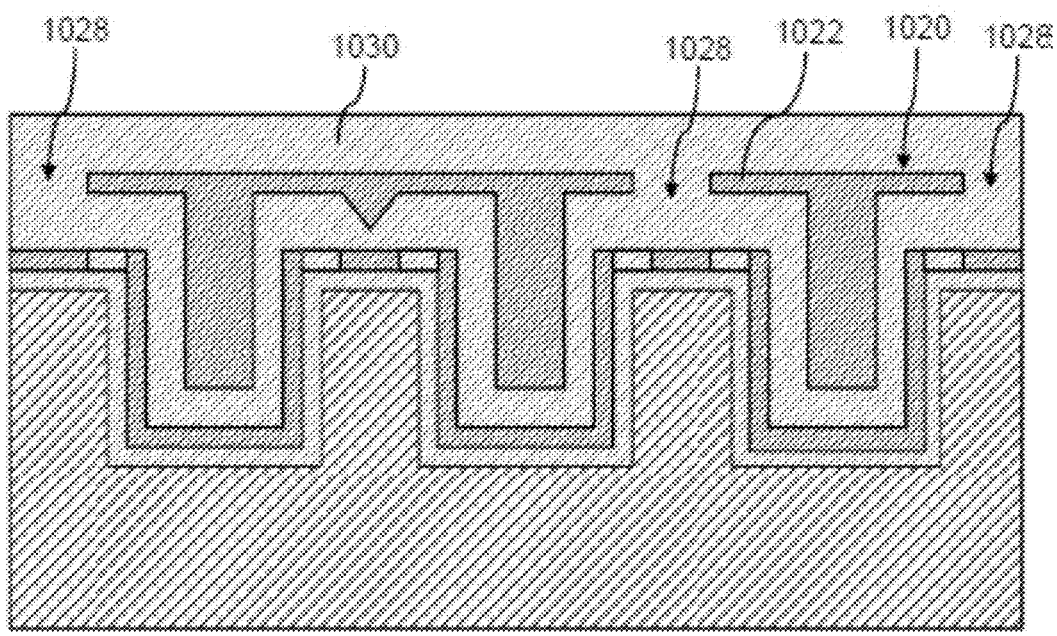

As shown in FIGS. 12a and 12b, at least one or a plurality of through openings or recesses 1028 can subsequently be formed in the base section 1022 of the reference electrode 1020. Afterward, a second sacrificial material layer 1030 can be deposited onto the first sacrificial material layer 1014 and also onto the base section 1022 of the reference electrode 1020. The second sacrificial material layer 1030 can be formed from the same material as the first sacrificial material layer 1014 and thus define with the latter a uniform sacrificial material layer.

Figure 13A:
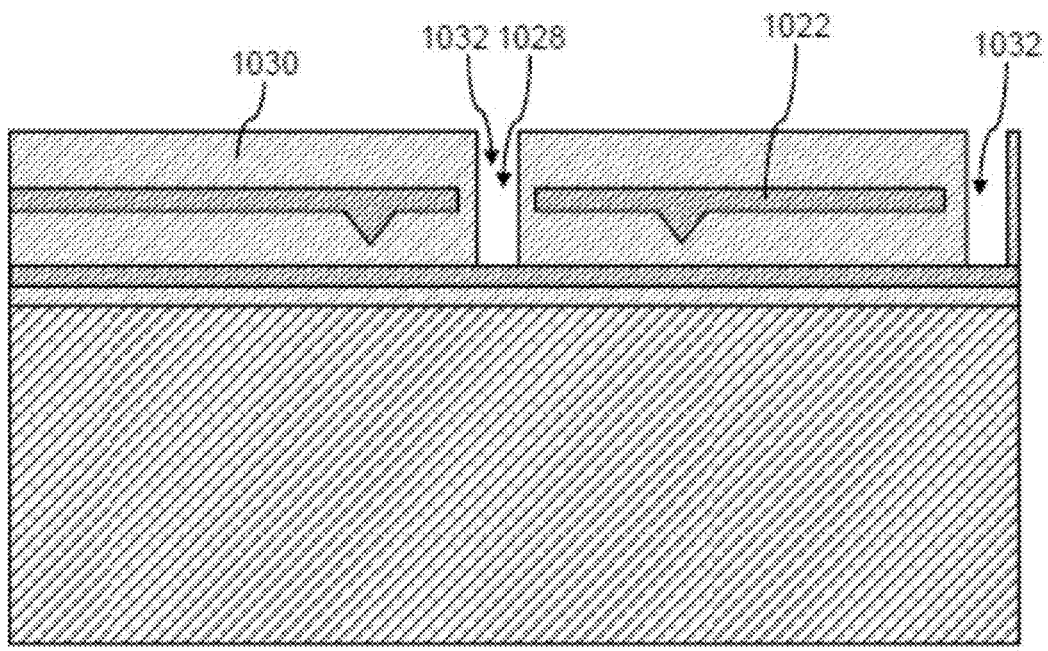
Figure 13B:
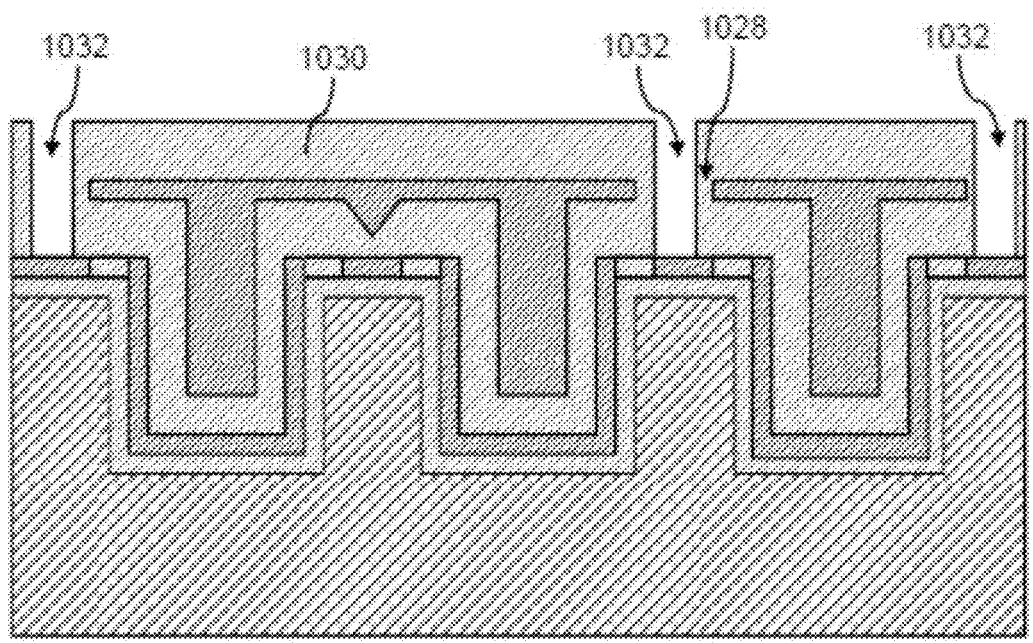

As shown in FIGS. 13a and 13b, in a further step, in the region of the through openings or recesses 1028 of the base section 1022 of the reference electrode 1020, a respective spacer cutout 1032 can be formed, for example by etching the first and second sacrificial material layers 1014, 1030. As shown in FIGS. 13a and 13b, a spacer cutout 1032 can have a smaller diameter than a corresponding through opening 1028 in the base section 1022, such that the base section 1022 is not exposed.

Figure 14A:
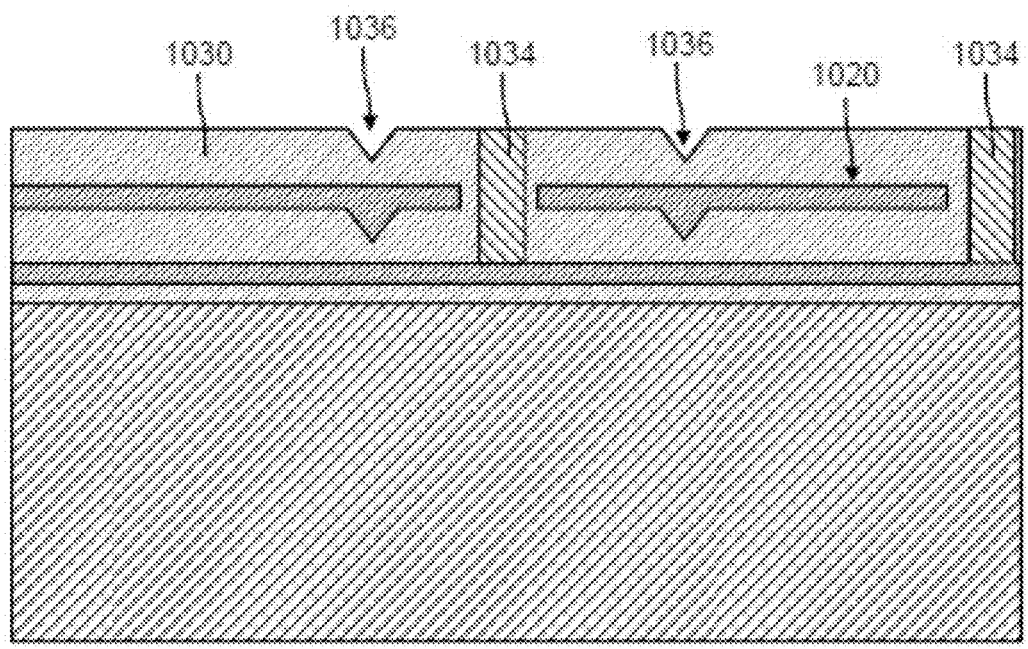
Figure 14B:
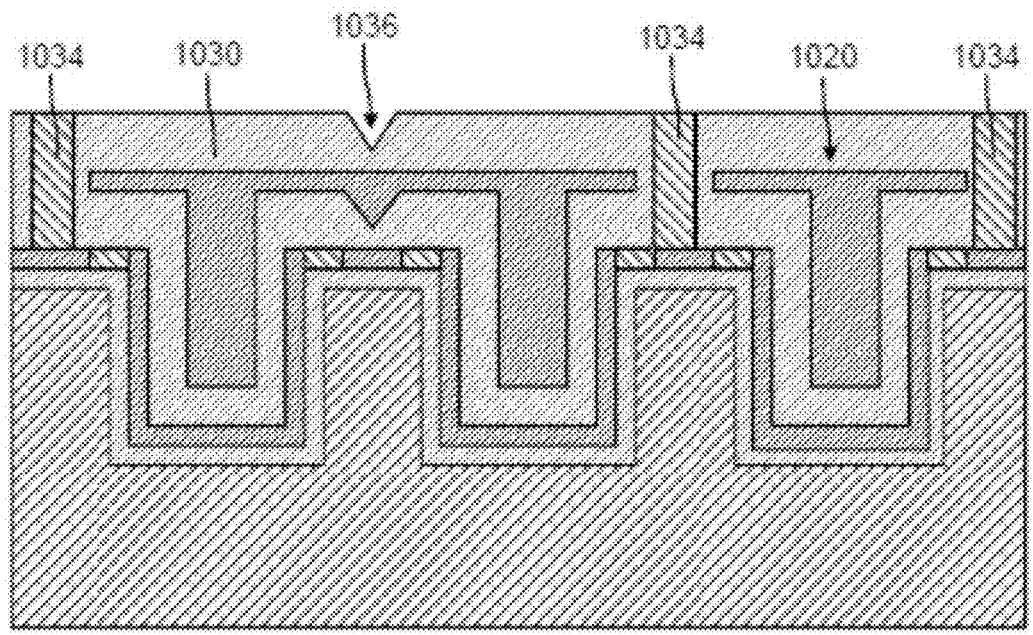

Afterward, as shown in FIGS. 14a and 14b, the spacer cutouts 1032 can be filled, as a result of which a plurality of spacers 1034 can be formed. The spacers 1034 can be formed for example from an electrically insulating material, such as, for instance, from $SiO_x$ or $Si_xN_y$. By virtue of the fact that the base section 1022 is not exposed during the process of forming the spacer cutouts 1032, spacers 1034 which are not in physical contact with the reference electrode 1020 can be provided as a result.

Figure 15A:
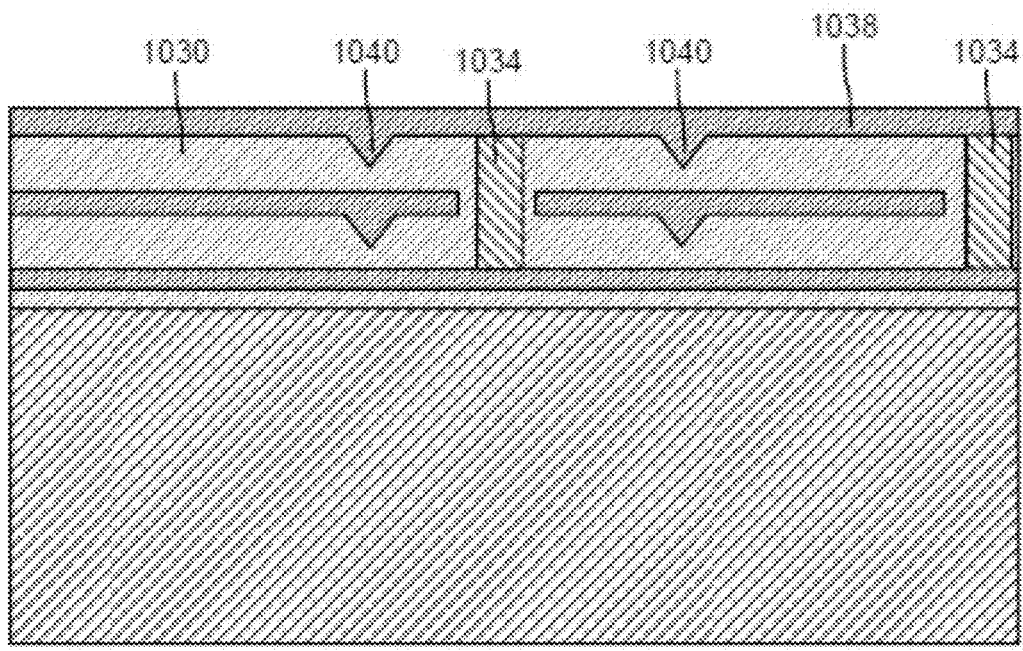
Figure 15B:
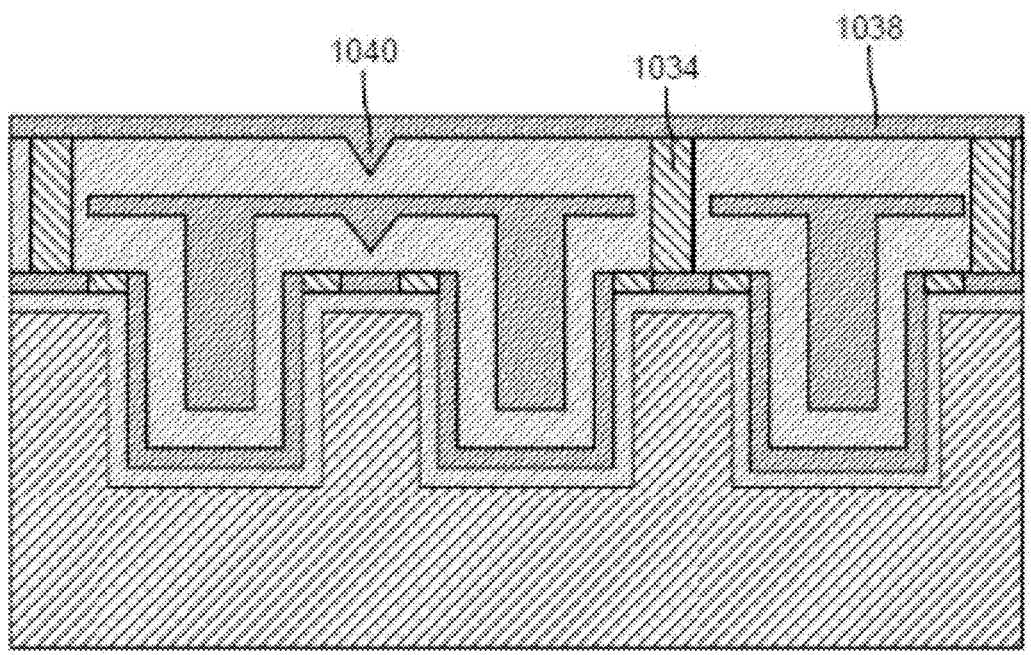

As is furthermore evident in FIGS. 14a and 14b, a plurality of recesses 1036 tapering in the direction of the reference electrode 1020 can additionally be formed in the second sacrificial material layer 1030, which recesses can be used as negative molds for membrane anti-stick projections of a second membrane 1038 formed subsequently, as shown in FIGS. 15a and 15b, on the second sacrificial material layer 1030 and also on end faces of the spacers 1034. The membrane anti-stick projections of the second membrane 1038 are provided with the reference signs 1040 in the figures. The second membrane 1038 can have a thickness of a few 100 nm, for example 500 nm.

Figure 16A:
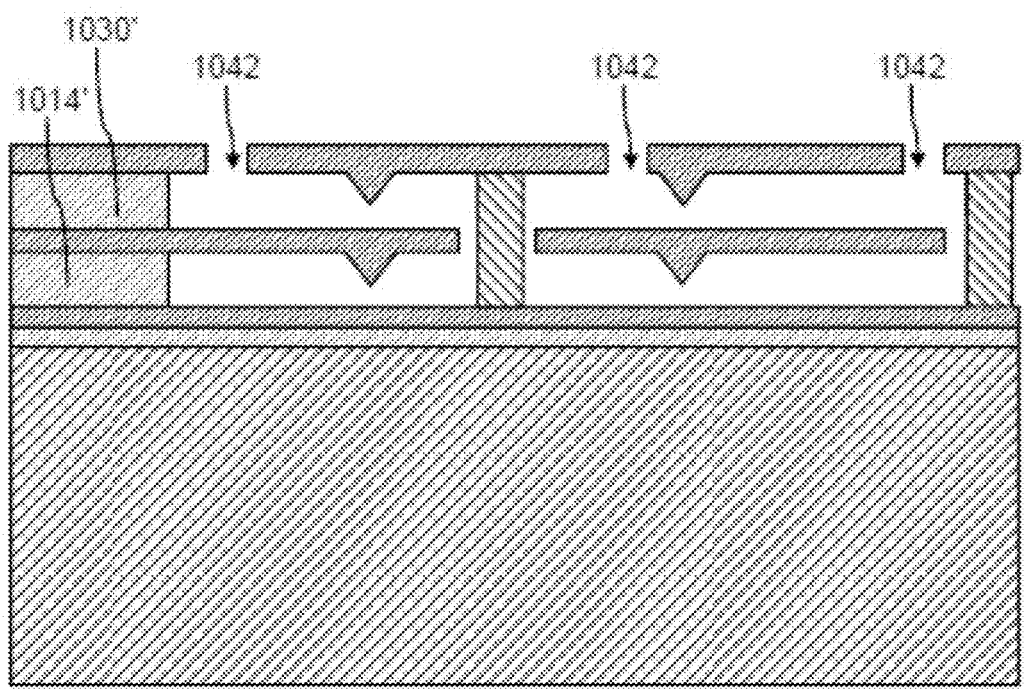
Figure 16B:
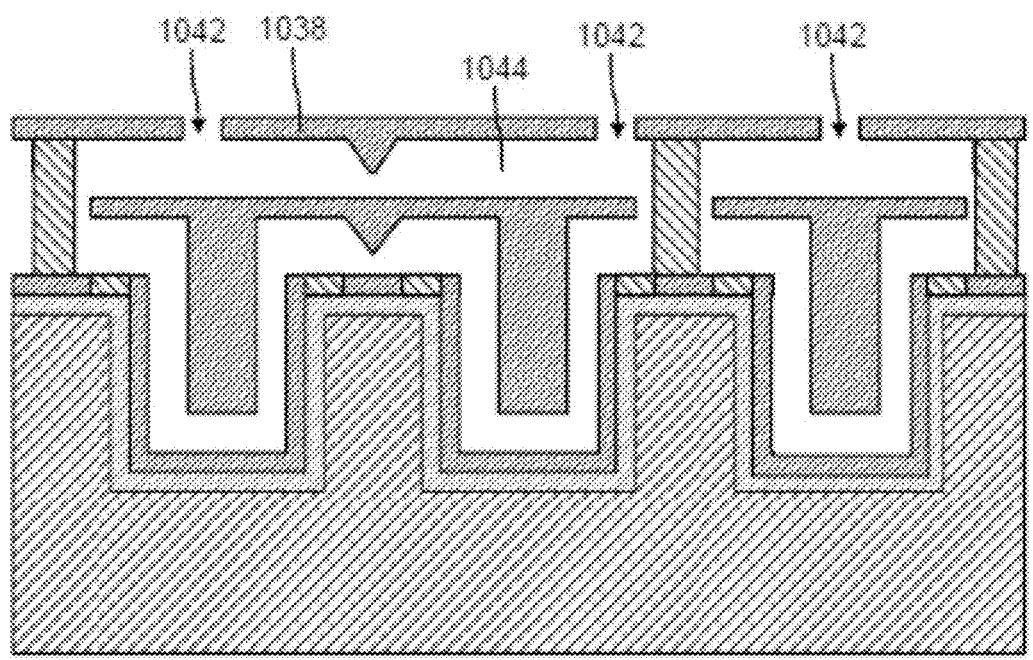

After the second membrane 1038 has been formed, a plurality of openings 1042 can be formed in said membrane, as shown in FIGS. 16a and 16b, through which openings a part of the first sacrificial material layer 1014 and also of the second sacrificial material layer 1030 can be removed. Removing the first sacrificial material layer 1014 and also the second sacrificial material layer 1030 through the openings 1042 can be carried out by etching, for example. The first sacrificial material layer 1014 and the second sacrificial material layer 1030 can be removed completely apart from an edge region. In this way, the supporting elements described in connection with the sound detection unit 108 shown in FIGS. 2 and 3 can be formed from the first sacrificial material layer 1014 and the second sacrificial material layer 1030. Said supporting elements are indicated by the reference signs 1014' and 1030' in FIG. 16*a*.

Removing a part of the first sacrificial material layer 1014 and also of the second sacrificial material layer 1030 can be carried out for example in a gas atmosphere in which a lower gas pressure relative to normal pressure prevails. Alternatively, it is possible for a gas pressure that is lower than normal pressure to be produced only after the process of removing the part of the first sacrificial material layer 1014 and of the second sacrificial material layer 1030, in order thereby to form between the first membrane 1008 and the second membrane 1038 a low-pressure chamber 1044 in which a reduced gas pressure relative to normal pressure is present.

Figure 17A:
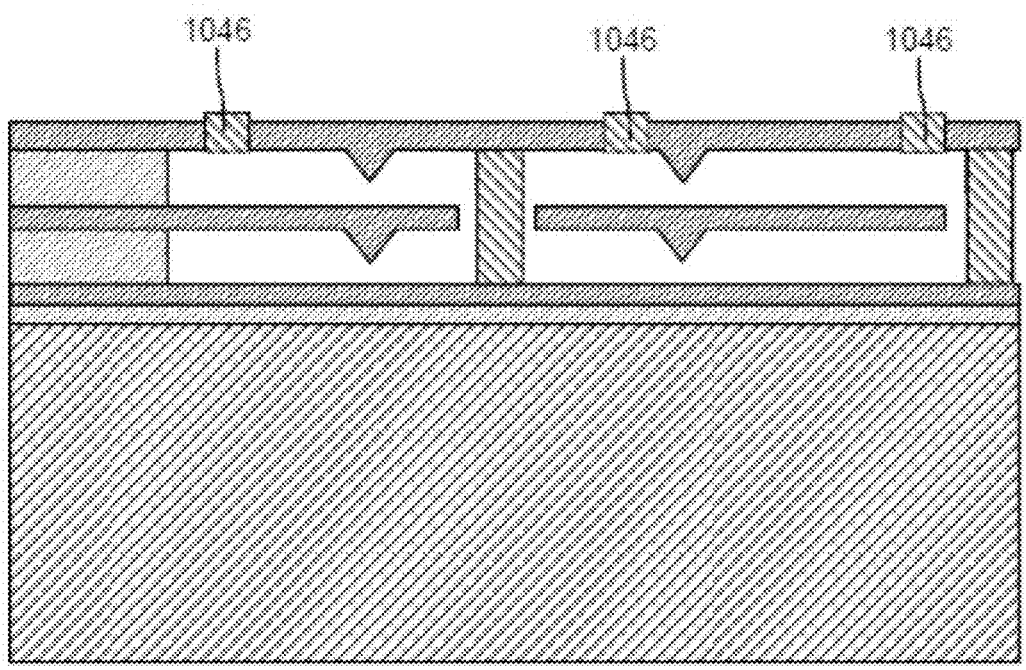
Figure 17B:
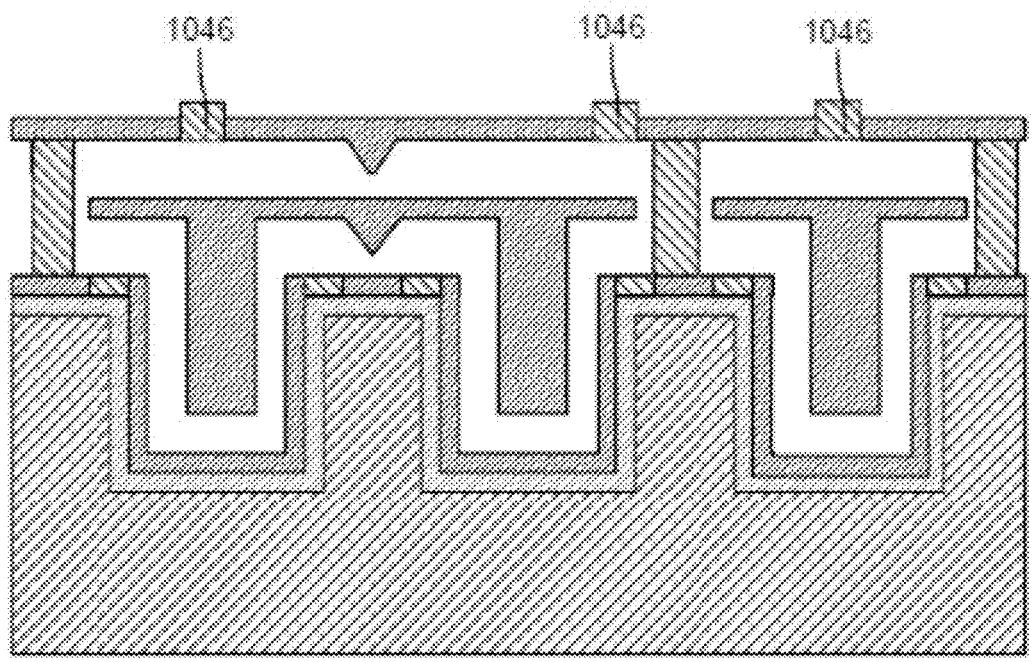
Figure 18A:
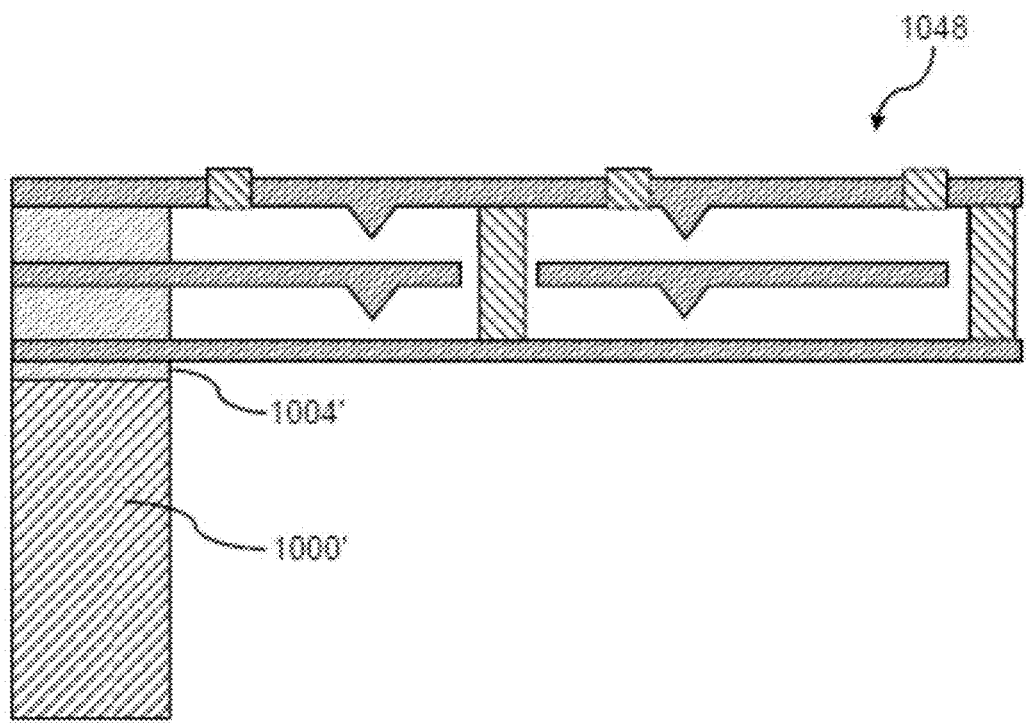
Figure 18B:
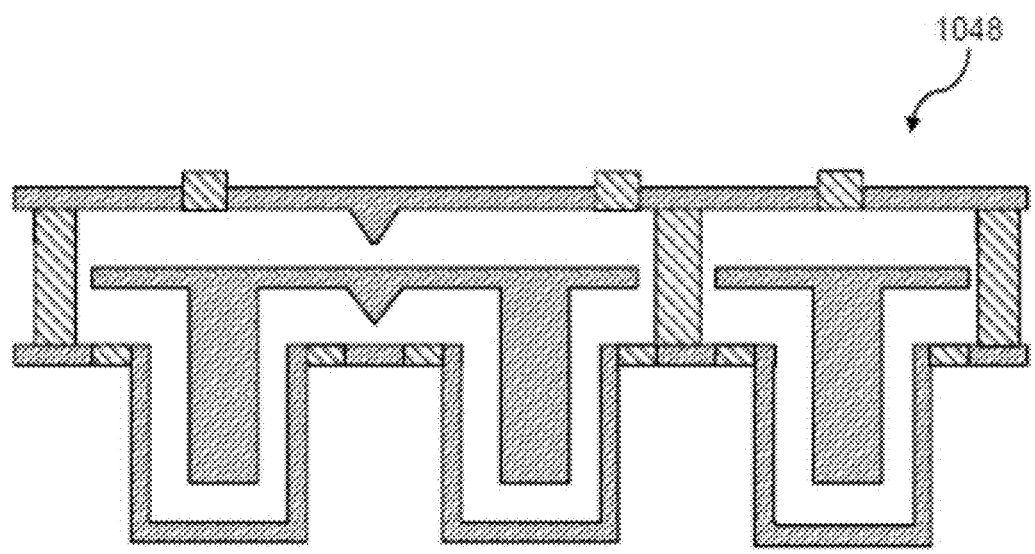

In order to be able to permanently maintain the low gas pressure in the low-pressure chamber 1044, it is possible, as indicated in FIGS. 17*a* and 17*b*, for the openings 1042 in the second membrane 1038 to be closed by respective closure elements 1046. The closure elements 1046 can be formed for example by depositing an electrically insulating material onto the second membrane 1038 in the region of the respective openings 1042.

After closing the openings 1042 in the second membrane 1038, it is possible to remove a part of the holder 1000 and of the electrically insulating layer 1004 arranged between the holder 1000 and the first membrane 1008, for example by etching. In this way, it is possible to form a holder 1000' that is separated from the first membrane 1008 by a supporting element 1004'. Said supporting element corresponds to the supporting element 105*c* shown in FIG. 2.

Forming the holder 1000' concludes the production of a sound detection unit 1048 which, in terms of its construction, corresponds to the sound detection unit 108 shown in FIGS. 2 and 3. Therefore, for explanation of the further structural features shown in FIGS. 18*a* and 18*b*, reference is made to the description of the sound detection unit 108 shown in FIGS. 2 and 3, in order to avoid repetitions.

A further exemplary sound detection unit will be described below by reference to FIGS. 19 and 20. In this case, components and component sections identical and functionally identical to those in FIGS. 2 and 3 will be provided with the same reference signs as in FIGS. 2 and 3, although increased by the number 300 with respect to the sound detection unit 108 shown in FIGS. 2 and 3. The sound detection unit 408 shown in FIGS. 19 and 20 will be described only insofar as it differs from the sound detection unit 108, to the description of which, for the rest, reference is expressly made.

Figure 19:
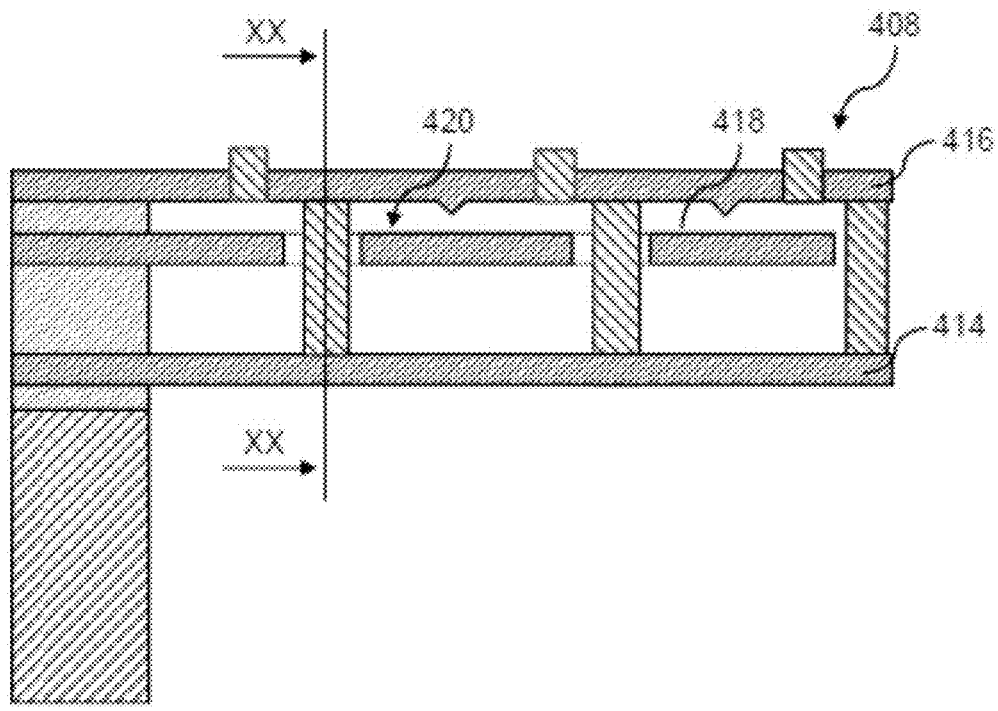
FIGS. 19-22 show simplified sectional views of sound detection units of a microelectromechanical microphone in accordance with various embodiments.
Figure 20:
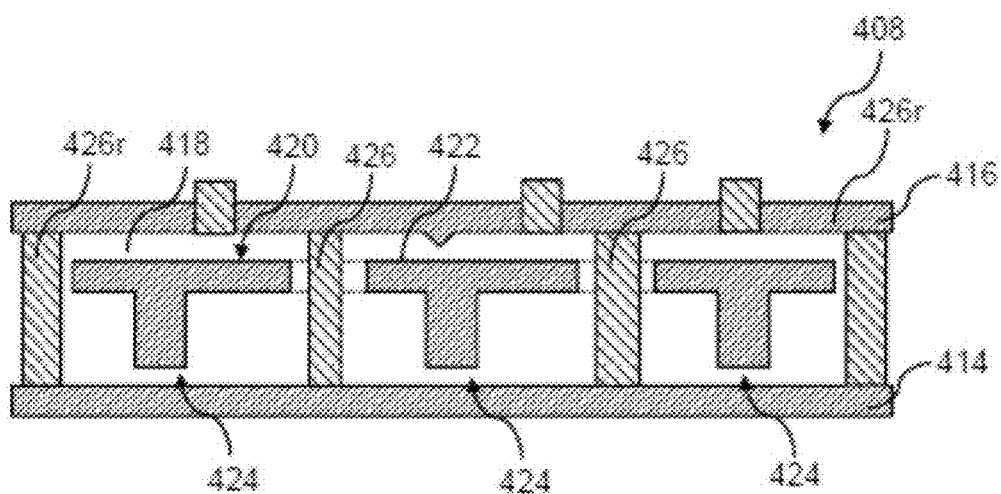

FIGS. 19 and 20 show simplified sectional illustrations of the sound detection unit 408. The sectional area in accordance with FIG. 20 is indicated by the line XX-XX in FIG. 19.

In a manner similar to the sound detection unit 108 shown in FIGS. 2 and 3, the sound detection unit 408 shown in FIGS. 19 and 20 comprises a first membrane 414, a second membrane 416, a low-pressure chamber 418 provided between the first membrane 414 and the second membrane 416, and also a reference electrode 420 provided at least in sections in the low-pressure chamber 418. The reference electrode 420 comprises a planar base section 422 and also a stiffening structure 424 provided on the base section 422. In contrast to the first membrane 114 of the sound detection unit 108, the first membrane 414 of the sound detection unit 408 does not have a shape that is complementary to the stiffening structure 424. Accordingly, the first membrane 414 is spaced apart from the base section 422 further than the first membrane 114 is from the corresponding base section 122 of the sound detection unit 108. On account of this increased distance, a capacitance between the base section 422 and the first membrane 414 is small, such that a change in said capacitance that is caused by a displacement of the first membrane 414 relative to the base section 422 is suitable only to a limited extent for determining characteristics of the sound waves to be detected. However, the sound detection unit 408 can be provided with a significantly simpler overall construction by comparison with the sound detection unit 108, since the first membrane 414 has a significantly simpler shape than the membrane 114 of the sound detection unit 108.

In order to determine characteristics of sound waves to be detected, it is possible to read out an electrical signal that is caused by a change in a capacitance between the base section 422 and the second membrane 416.

In a manner similar to that in the case of the sound detection unit 108 shown in FIGS. 2 and 3, the first membrane 414 and the second membrane 416 can be electrically insulated from one another, for example by electrically insulating spacers 426, 426*r*. This construction affords the possibility of using the reference electrode 420 in cooperation with the first membrane 414 as an actuator unit in order to be able to set for example electrostatically a defined initial position of the first and second membranes 414, 416 relative to the reference electrode 420. This has been described thoroughly in connection with the sound detection unit 108 shown in FIGS. 2 and 3 and will not be explained again here, in order to avoid repetitions.

A further exemplary sound detection unit will be described below by reference to FIG. 21. In this case, components and component sections identical and functionally identical to those in the case of the sound detection unit 408 will be provided with the same reference signs, although increased by the number 100 with respect thereto. In this case, the sound detection unit 508 shown in FIG. 21 will be described only insofar as it differs from the sound detection unit 408, to the description of which, for the rest, reference is expressly made.

Figure 21:
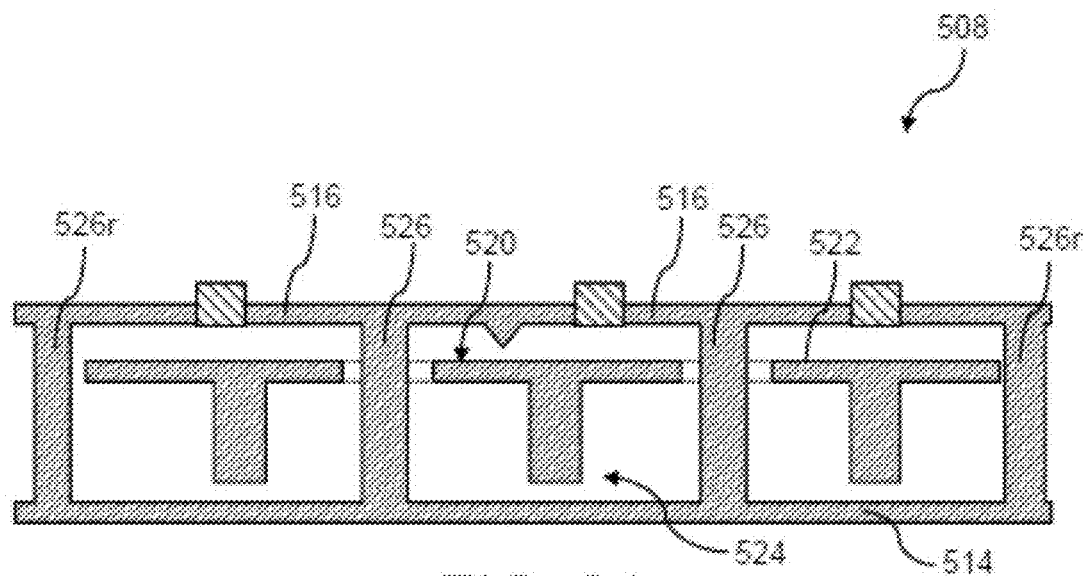

In the case of the sound detection unit 508 shown in FIG. 21, the first membrane 514 and the second membrane 516 are electrically connected to one another by means of a plurality of spacers 526, 526*r*. As already explained with respect to the sound detection unit 408, a capacitance between the base section 522 of the reference electrode 520 and the first membrane 514 can be less than a capacitance between the base section 522 and the second membrane 516, since the distance between the first membrane 514 and the base section 522 is greater than the distance between the second membrane 516 and the base section 522. Nevertheless, by adding signals that are caused firstly by a change in a capacitance between the first membrane 516 and the reference electrode 520 and secondly by a change in a capacitance between the second membrane 516 and the reference electrode 520, it is possible to achieve an increase in sensitivity in comparison with an evaluation of a sound-dictated change only in the capacitance between the second membrane 516 and the reference electrode 520.

A further exemplary sound detection unit will be described below by reference to FIG. 22. In this case, components and component sections identical and functionally identical to those in FIG. 21 will be provided with the same reference signs, although increased by the number 100 with respect to FIG. 21. In this case, the sound detection unit 608 shown in FIG. 22 will be described only insofar as it differs from the sound detection unit 508, to the description of which, for the rest, reference is expressly made.

Figure 22:
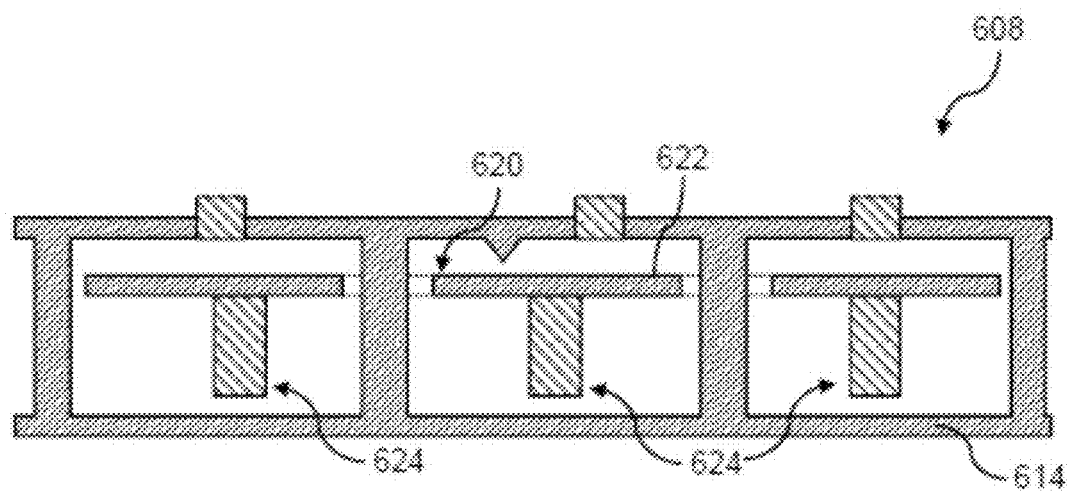

The sound detection unit 608 shown in FIG. 22 differs from the sound detection unit 508 with regard to the configuration of the reference electrode 620, in the case of which, in contrast to the sound detection unit 508, the base section 622 and the stiffening structure 624 can be produced from different materials. In contrast to the stiffening structure 524 of the sound detection unit 508, the stiffening structure 624 can be formed from a dielectric in order to eliminate a parasitic capacitance between the first membrane 614 and the stiffening structure 624, which can ultimately contribute to an increased sensitivity.

One exemplary method for producing the sound detection unit 408 shown in FIGS. 19 and 20 will be described below by reference to FIGS. 23a to 31b. The sectional views shown in these figures are simplified sectional views that merely show a sectional area. Figures denoted by the same number but by a different suffix "a" and "b" illustrate sectional views along mutually orthogonal sectional areas of the sound detection unit in a predefined state during the production thereof.

Figure 23A:
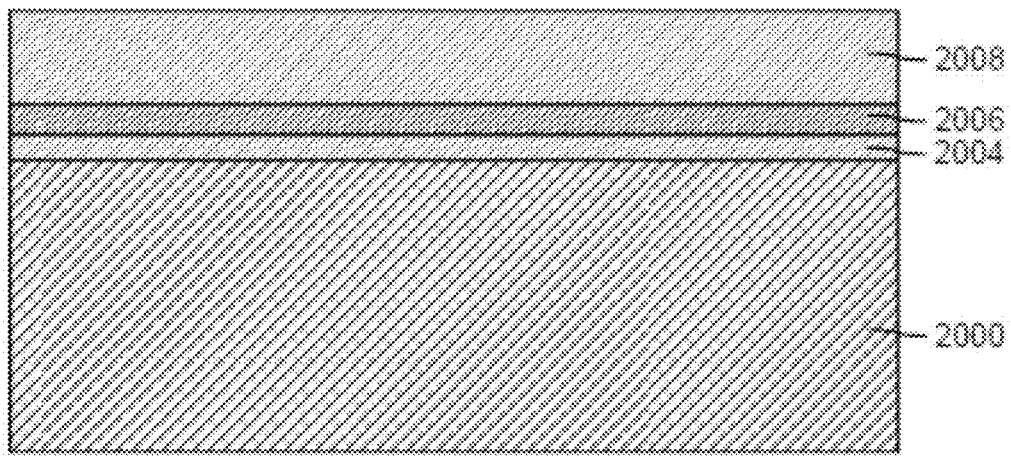
FIGS. 23a-31b show simplified sectional views which illustrate one exemplary method for producing a sound detection unit of one exemplary microelectromechanical microphone.
Figure 23B:
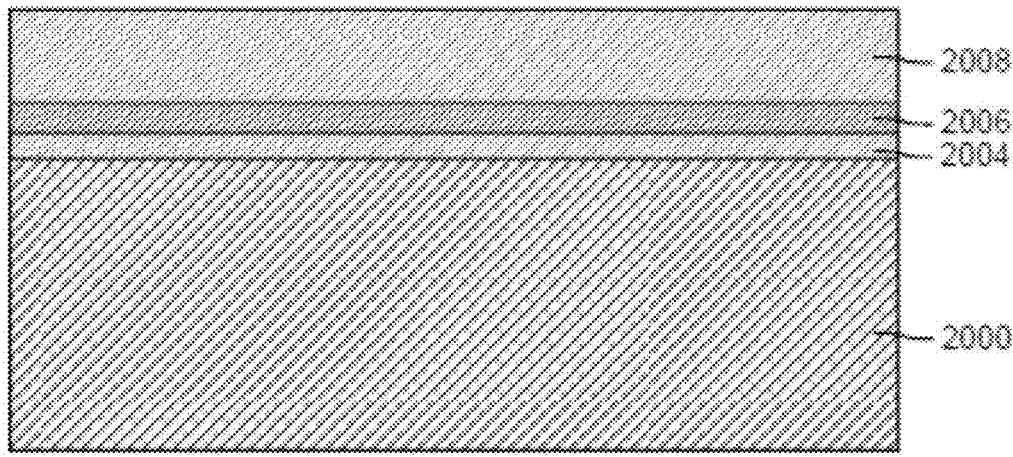

As shown in FIGS. 23a and 23b, at the beginning of the method, firstly an electrically insulating layer 2004 can be deposited onto a substrate 2000. The substrate 2000 can be for example a semiconductor substrate, such as, for instance, a silicon substrate. The electrically insulating layer 2004 can be for example an $SiO_x$ layer. Afterward, as likewise shown in FIGS. 23a and 23b, an electrically conductive layer 2006 having a thickness of a few 100 nm, for example 500 nm, can be applied on the electrically insulating layer 2004, said electrically conductive layer corresponding to a first membrane of the sound detection unit to be produced. A first sacrificial material layer 2008, for example an $SiO_x$ layer, can then be applied on the first membrane 2006. Said layer can have a thickness of approximately 5-10 μm.

Figure 24A:
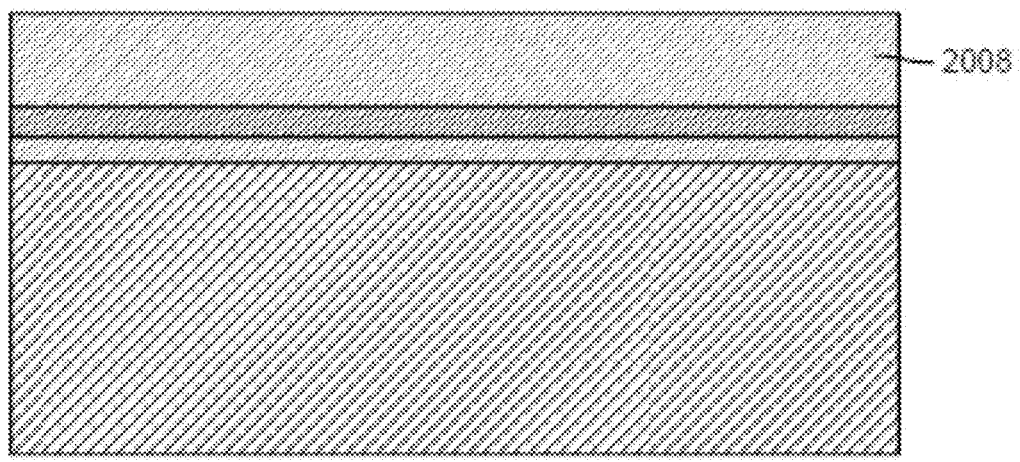
Figure 24B:
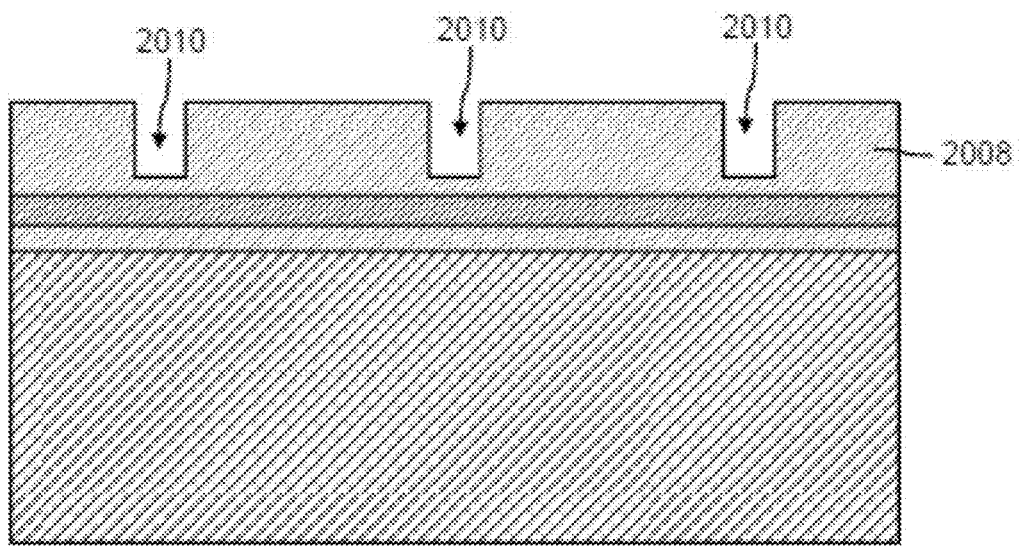

As shown in FIGS. 24a and 24b, afterward a plurality of cutouts 2010 can be formed in the first sacrificial material layer 2008 by removing a part of the first sacrificial material layer 2008. A plurality of grooves which extend substantially parallel to a side edge of the substrate 2000 can be formed as a result. FIG. 24a is a sectional illustration along a sectional plane parallel to the grooves. Therefore, the grooves 2010 are not visible in FIG. 24a.

Figure 25A:
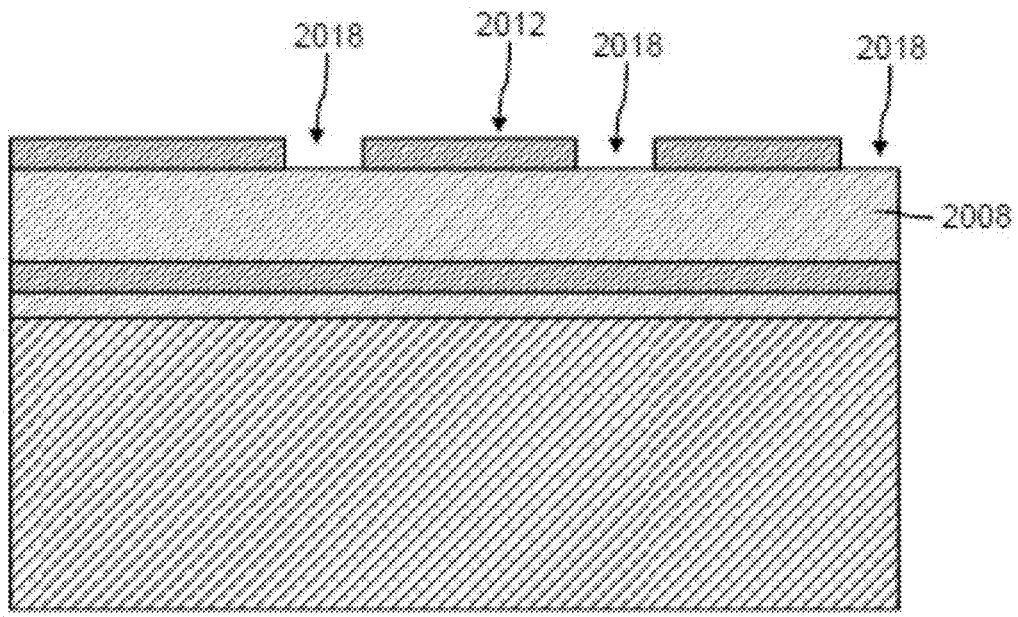
Figure 25B:
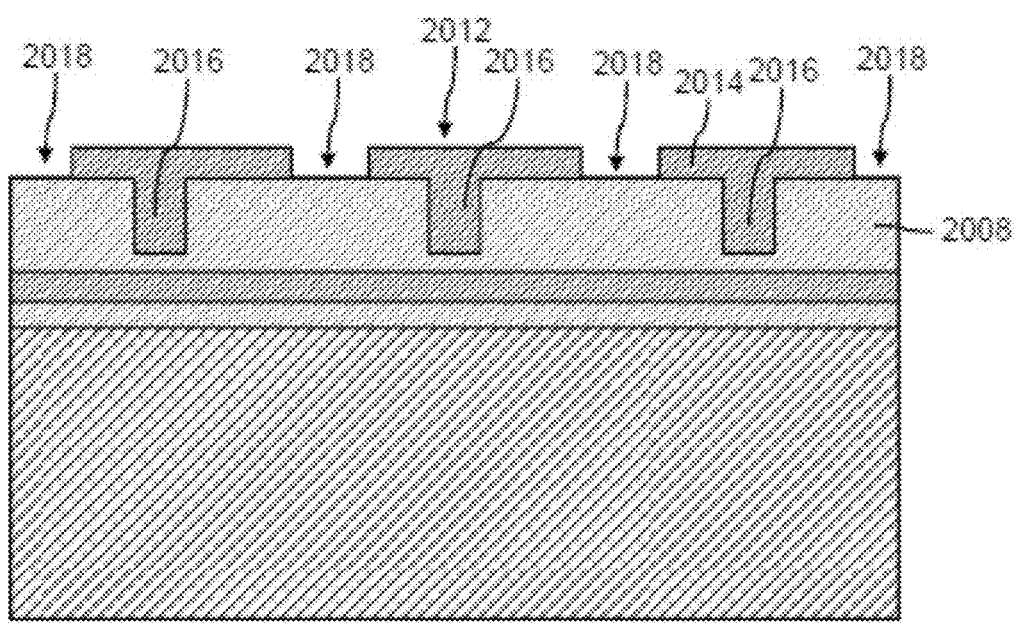

The grooves 2010 formed by removing sacrificial material from the first sacrificial material layer 2008 form a negative mold of a stiffening structure to be formed later of a reference electrode, which is shown in FIGS. 25a and 25b. As shown in these figures, a reference electrode 2012 can be formed on the first sacrificial material layer 2008, for example by depositing an electrically conductive material. As a result, the recesses 2010 formed in the first sacrificial material layer 2008 are filled with electrically conductive material, as a result of which a stiffening structure 2016 configured integrally with a substantially planar base section 2014 can be formed. As shown in FIGS. 25a and 25b, a plurality of through openings or cutouts 2018 can be formed in the base section 2014.

Figure 26A:
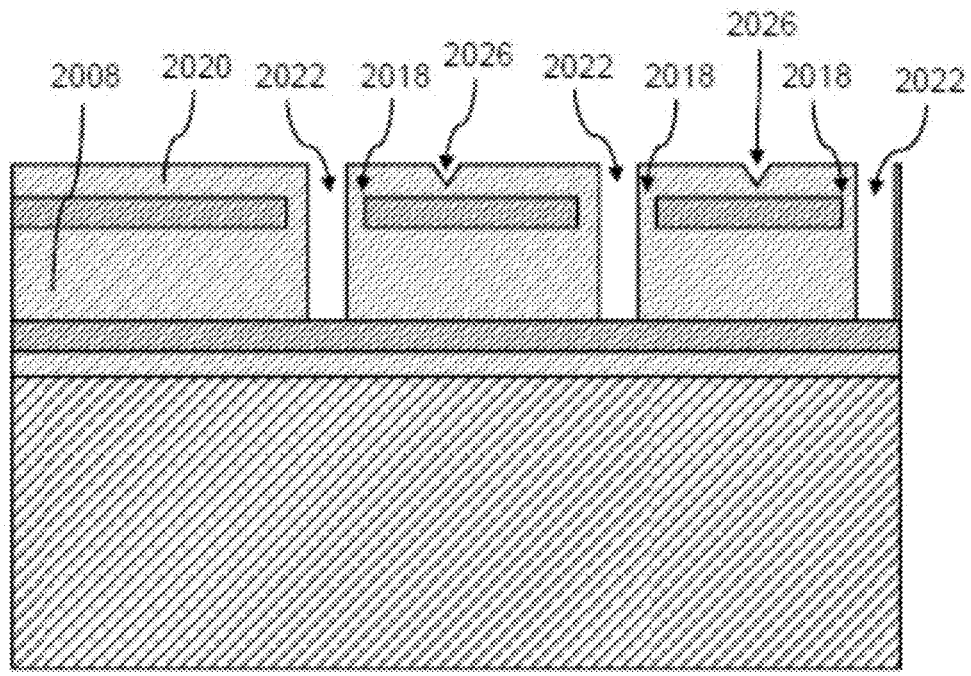
Figure 26B:
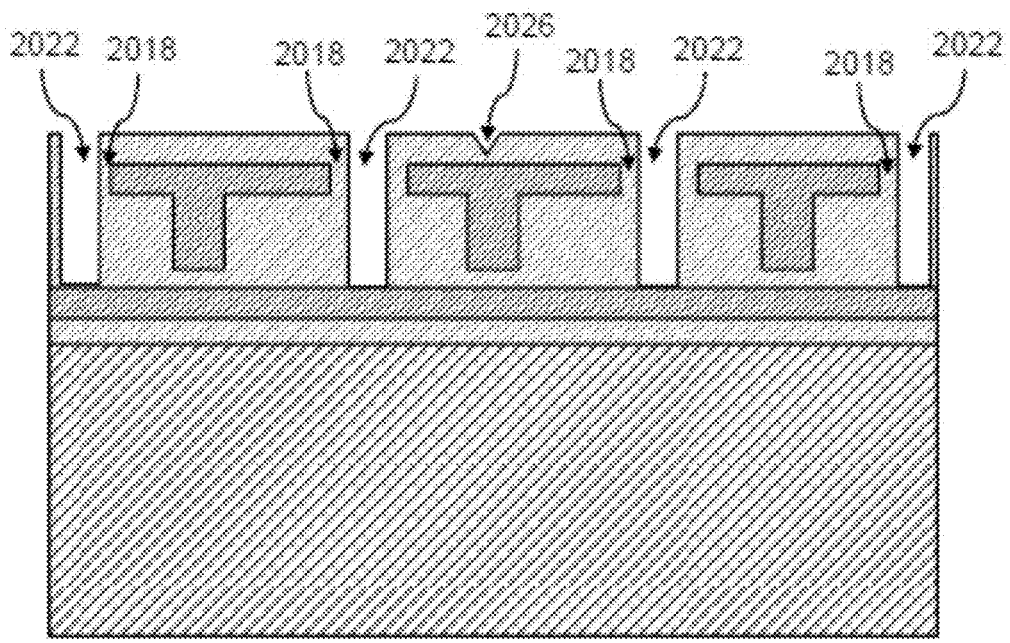

Afterward, as shown in FIGS. 26a and 26b, a second sacrificial material layer 2020 can be deposited onto the first sacrificial material layer 2008 and also onto the base section 2014, which second sacrificial material layer can be formed from the same material as the first sacrificial material layer 2008, such that a uniform sacrificial material layer can be formed as a result. In the region of the cutouts or through openings 2018 in the base section 2014, spacer cutouts 2022 can subsequently be formed in the first sacrificial material layer 2008 and the second sacrificial material layer 2020. Said spacer cutouts can be formed in the first and second sacrificial material layers 2008, 2020 in such a way that no part of the base section 2014 is exposed, which is shown in FIGS. 26a and 26b. Afterward, a respective spacer 2024 can be formed in the spacer cutouts 2022 by depositing an electrically insulating material. Furthermore, recesses 2026 tapering in the direction of the base section 2014 can be formed into the second sacrificial material layer 2020, which recesses can serve as negative molds for membrane antistick projections to be formed later.

Figure 27A:
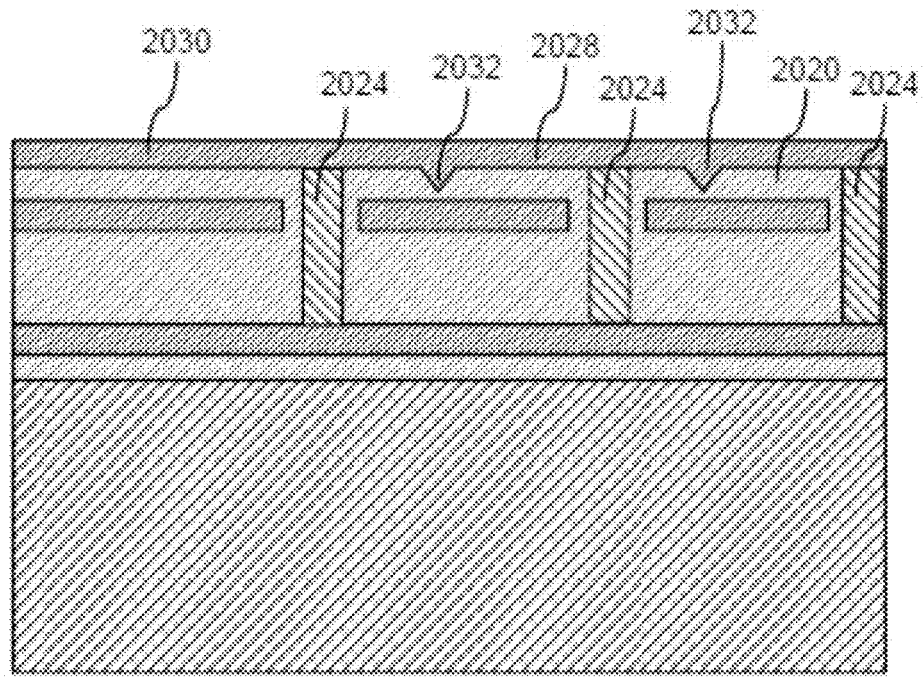
Figure 27B:
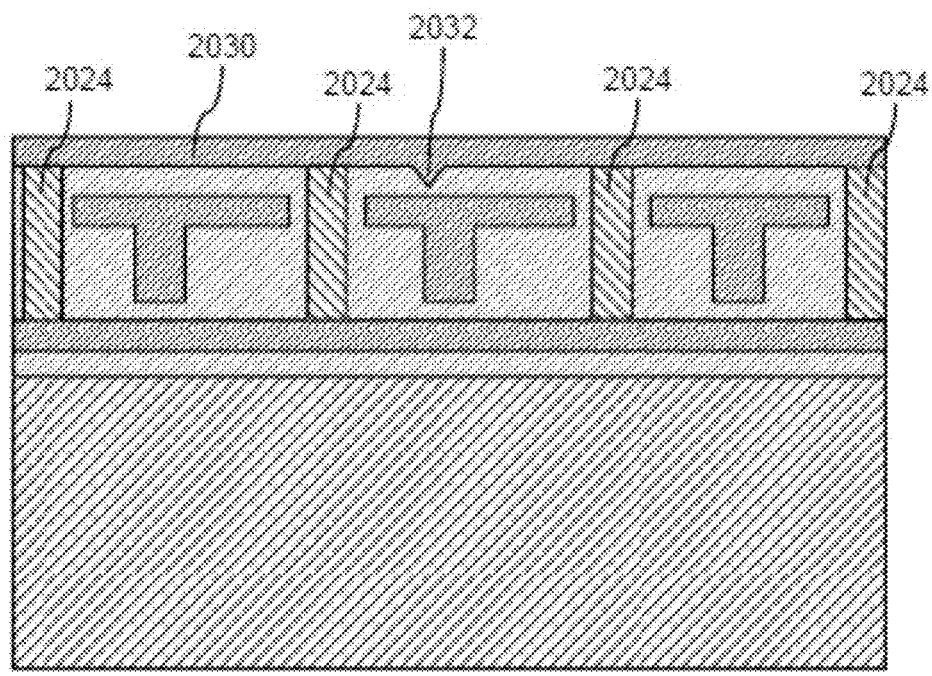

As shown in FIGS. 27a and 27b, an electrically conductive layer 2028 can then be deposited onto the second sacrificial material layer 2020, onto the end faces of the spacers 2024 and also into the negative molds 2026 for the membrane anti-stick projections. A second membrane 2030 is formed as a result. The membrane anti-stick projections of the second membrane 2030 are provided with the reference sign 2032 in FIGS. 27a and 27b.

Figure 28A:
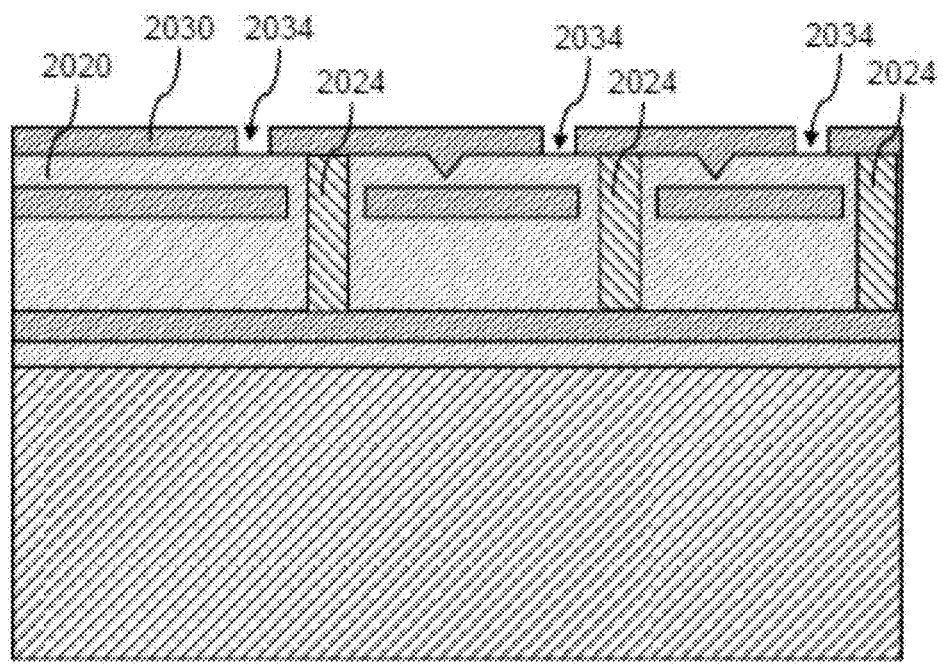
Figure 28B:
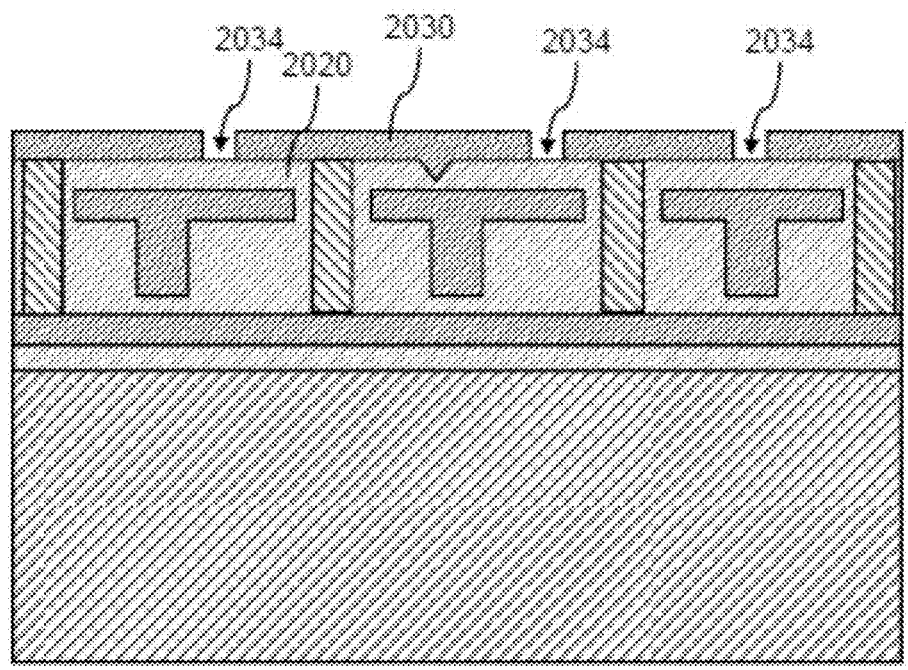
Figure 29A:
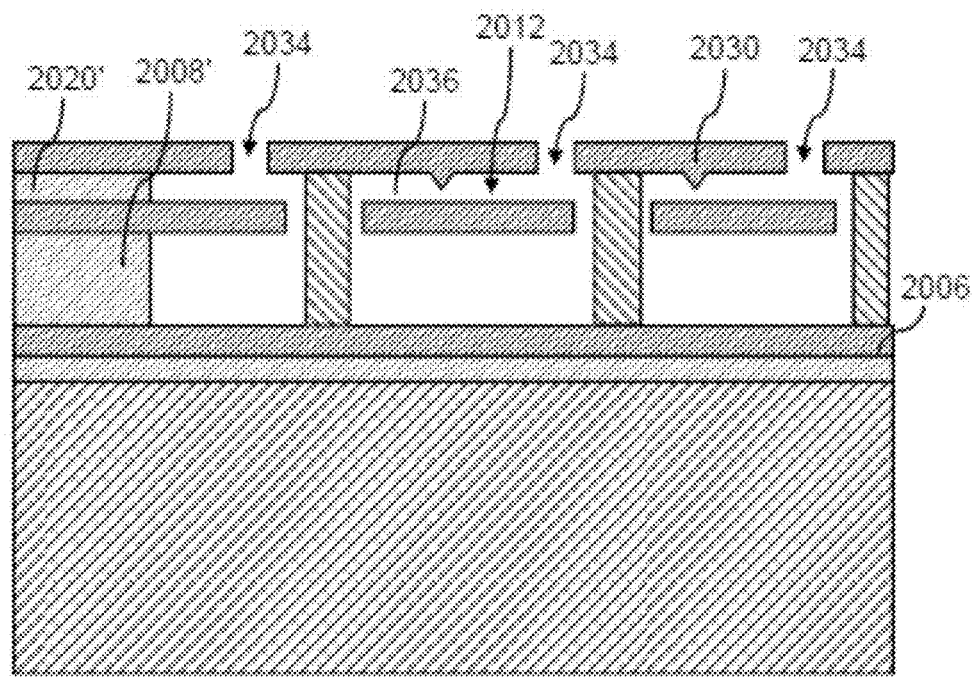
Figure 29B:
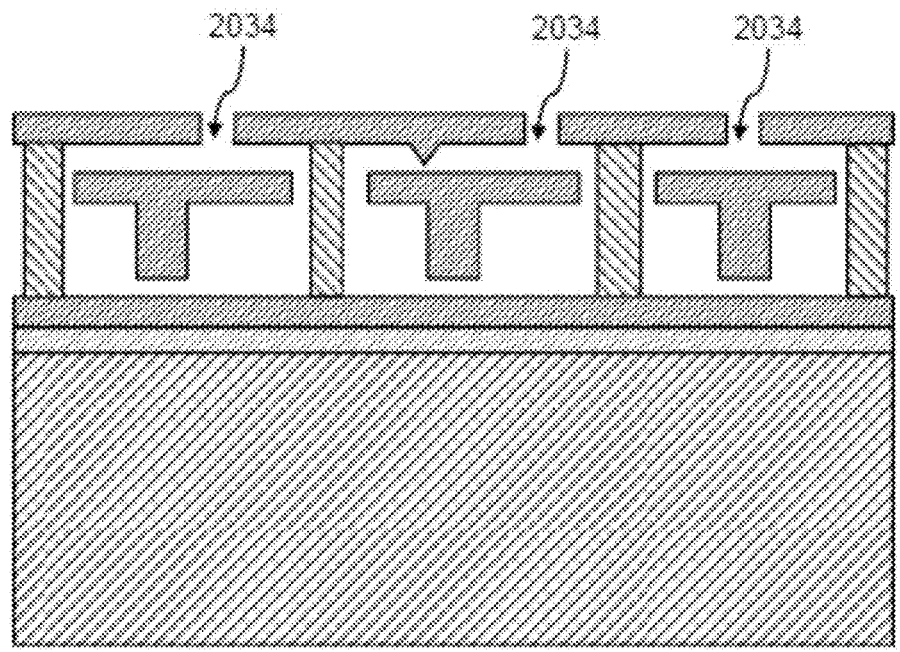

Afterward, as indicated in FIGS. 28a and 28b, a plurality of openings 2034 can be formed into the second membrane 2030, said openings exposing a part of the second sacrificial material layer 2020. A part of the first sacrificial material layer 2008 and of the second sacrificial material layer 2020 can be removed through the openings 2034. This is shown in FIGS. 29a and 29b. The removing can be carried out for example by selectively etching the first sacrificial material layer 2008 and the second sacrificial material layer 2020. Just an edge region of the first sacrificial material layer 2008 and of the second sacrificial material layer 2020 can remain in order to form an electrically insulating supporting element 2008' between the first membrane 2006 and the reference electrode 2012 and also a second electrically insulating supporting element 2020' between the reference electrode 2012 and the second membrane 2030.

Figure 30A:
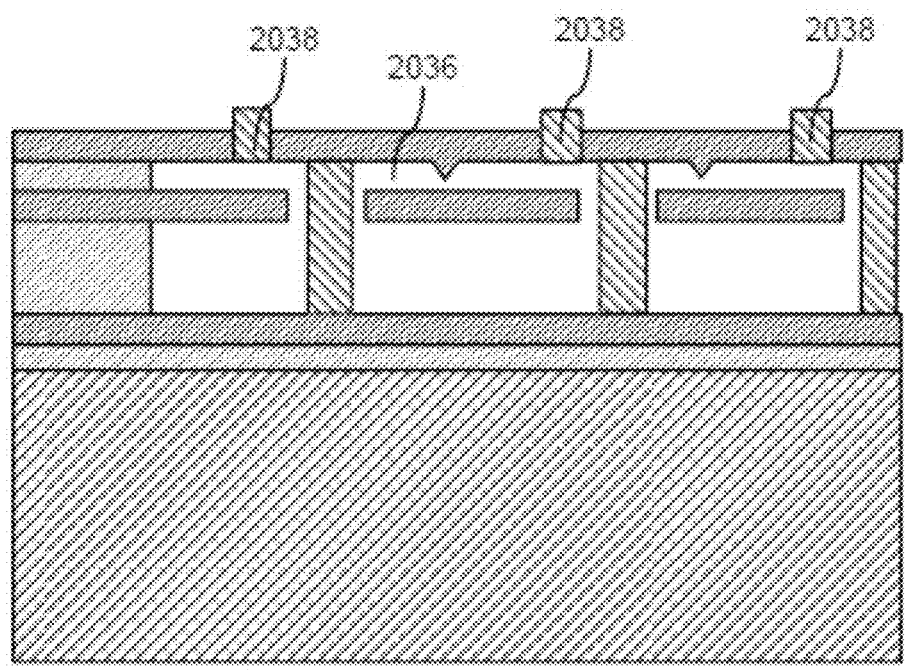
Figure 30B:
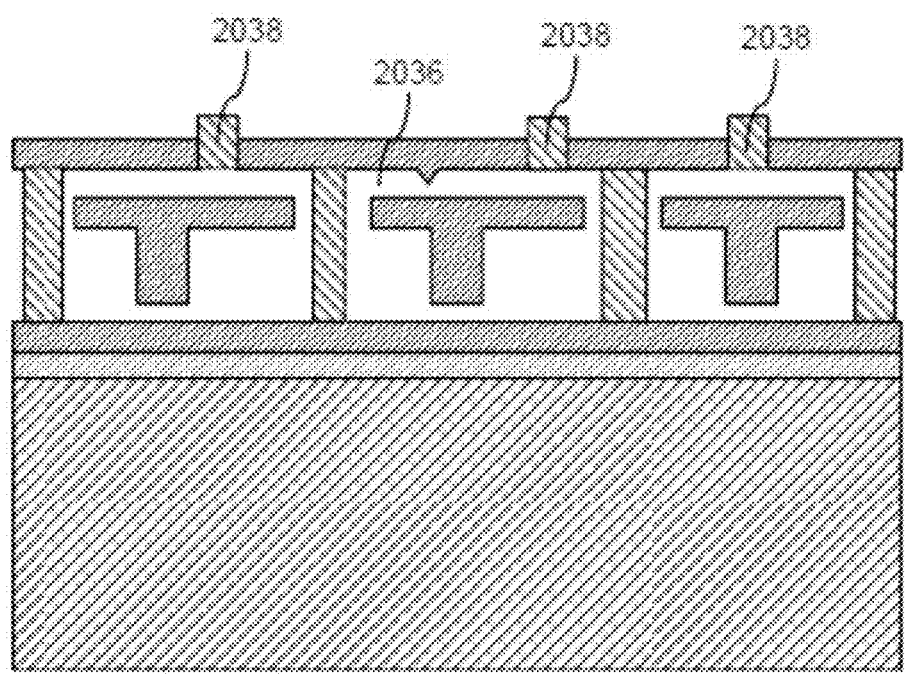

Removing a part of the first sacrificial material layer 2008 and also of the second sacrificial material layer 2020 forms a chamber between the first membrane 2006 and the second membrane 2030, which is connected to the surroundings for gas exchange only via the openings 2034 in the second membrane 2030. Consequently, via the openings 2034 it is possible to reduce the gas pressure within said chamber to a pressure that is lower than the normal pressure. As a result, a low-pressure chamber 2036 is thus formed, which has been described thoroughly in connection with the embodiments described above. In order to be able to maintain the low gas pressure in the low-pressure chamber 2036, a respective closure element 2038 can subsequently be formed in each opening 2034, as shown in FIGS. 30a and 30b, as a result of which the low-pressure chamber 2036 can be sealed in a gas-tight fashion. The closure elements 2038 can be formed for example from an electrically insulating material, such as, for instance, $SiO_x$ or $Si_xN_y$.

Figure 31A:
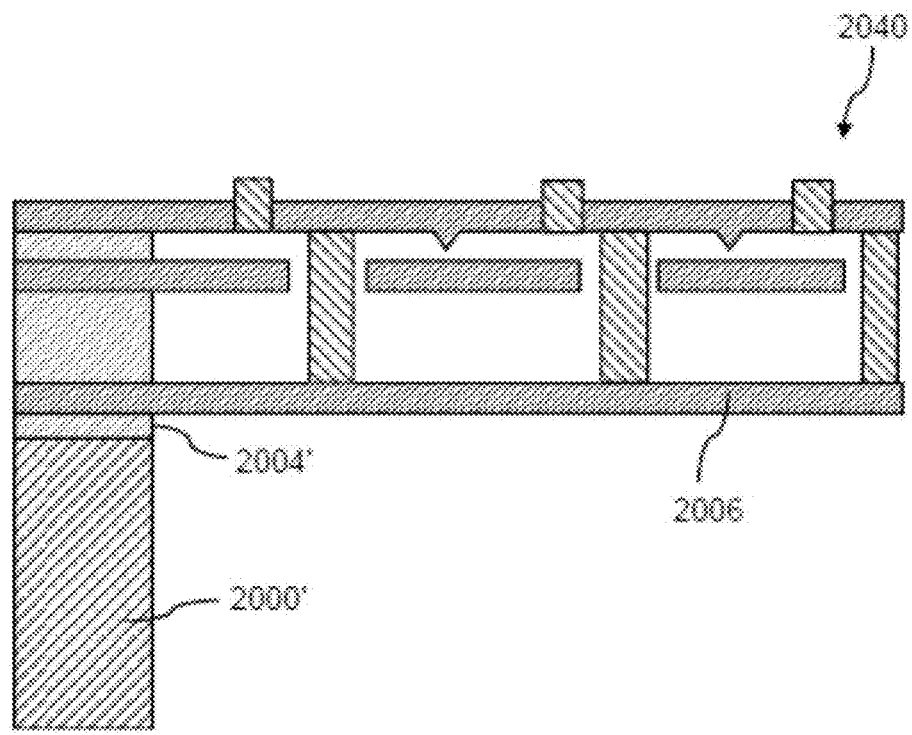
Figure 31B:
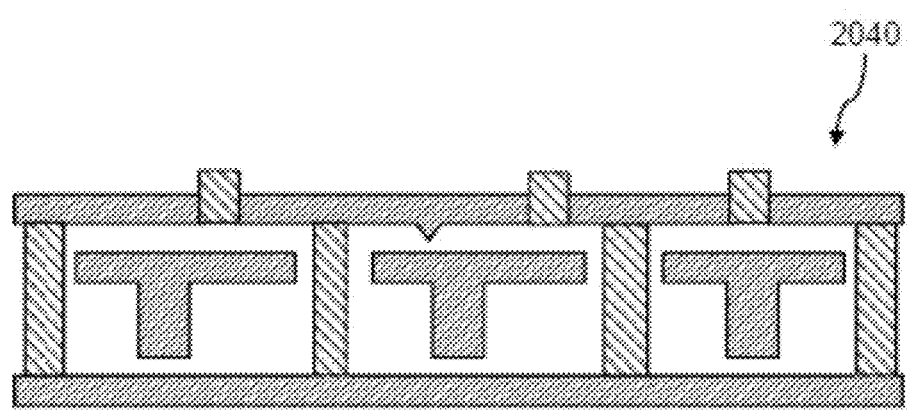

Afterward, as shown in FIGS. 31a and 31b, a part of the substrate 2000 and also of the electrically insulating layer 2004 formed on the substrate 2000 can be partly removed in order to form a holder 2000' and also an electrically insulating supporting element 2004' between the holder 2000' and the first membrane 2006.

A sound detection unit 2040 is thus completed which is identical to the sound detection unit 408 shown in FIGS. 19 and 20, to the description of which, for the rest, reference is made with regard to further details.

Figure 32:
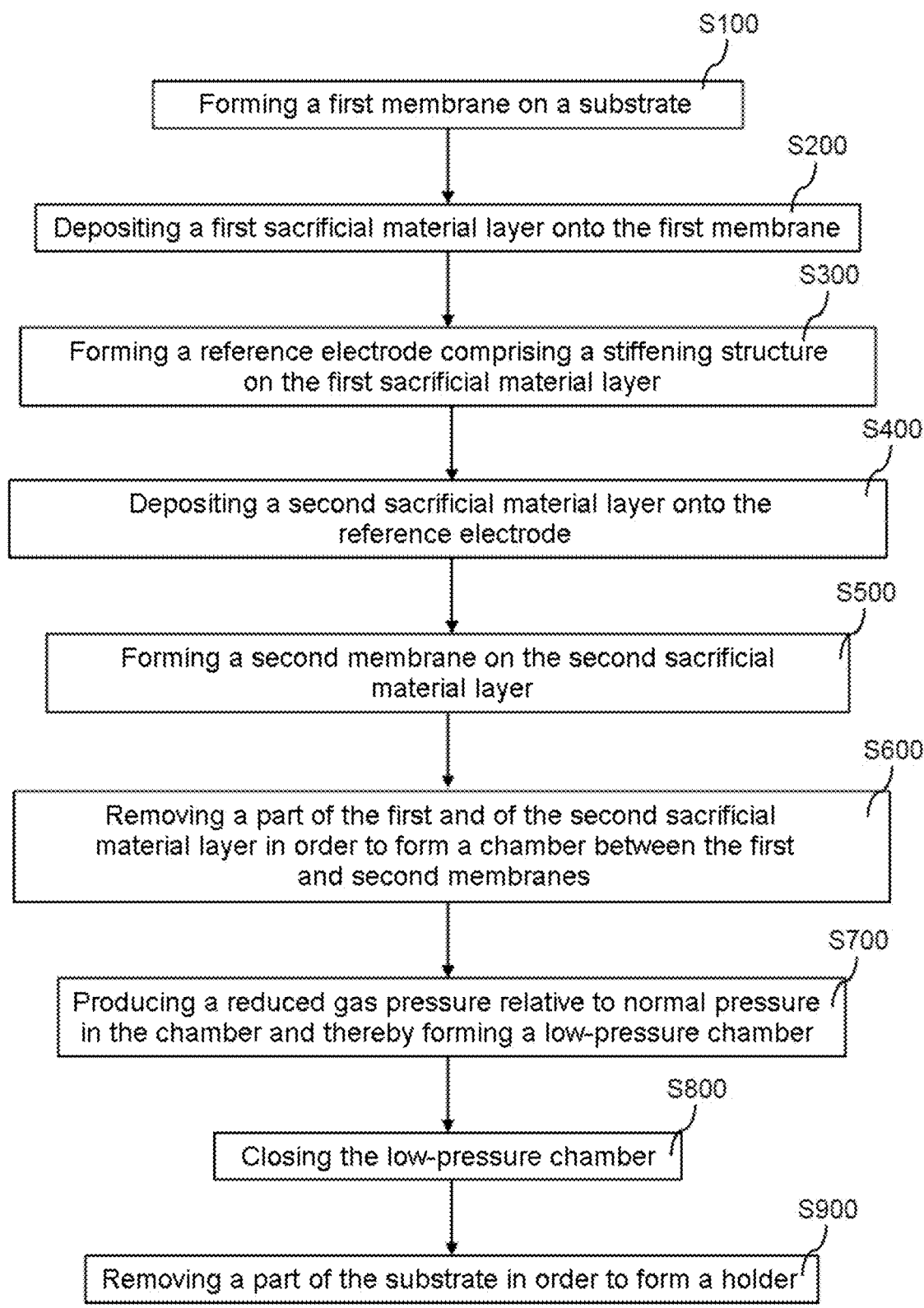
FIG. 32 shows a flow diagram of one exemplary method for producing a sound detection unit of a microelectromechanical microphone.

FIG. 32 shows a flow diagram of one exemplary method for producing one exemplary microelectromechanical microphone. The method can comprise: forming a first membrane on a substrate (S100), depositing a first sacrificial material layer onto the first membrane (S200), forming a reference electrode comprising a stiffening structure on the first sacrificial material layer (S300), depositing a second sacrificial material layer onto the reference electrode (S400), forming a second membrane on the second sacrificial material layer (S500), removing a part of the first and of the second sacrificial material layer in order to form a chamber between the first and second membranes (S600), producing a reduced gas pressure relative to normal pressure in the chamber and thereby forming a low-pressure chamber (S700), closing the low-pressure chamber (S800), and removing a part of the substrate in order to form a holder (S900).

Advantages of some embodiments include the ability to provide a microelectromechanical microphone having reproducible properties.

Numerous exemplary embodiments in accordance with the present disclosure are described below.

Example 1 is a microelectromechanical microphone which can comprise a holder and a sound detection unit carried on the holder. The sound detection unit can comprise: a planar first membrane, a planar second membrane arranged at a distance from the first membrane, wherein at least one from the first and second membranes is formed at least partly from an electrically conductive material, a low-pressure chamber formed between the first membrane and the second membrane, a reduced gas pressure relative to normal pressure being present in said low-pressure chamber, a reference electrode arranged at least in sections in the low-pressure chamber, said reference electrode being formed at least in sections from an electrically conductive material, wherein the first and second membranes are displaceable relative to the reference electrode by sound waves to be detected, wherein the reference electrode comprises a planar base section and also a stiffening structure provided on the base section, said stiffening structure being provided on a side of the base section that faces the first membrane or/and on a side of the base section that faces the second membrane.

In example 2, the subject matter of example 1 can optionally furthermore comprises the fact that the stiffening structure is provided on a single side of the base section that faces the first membrane or the second membrane.

In example 3, the subject matter of either of examples 1 and 2 can optionally furthermore comprise the fact that the stiffening structure comprises at least one stiffening rib protruding from the base section, optionally a plurality of stiffening ribs protruding from the base section.

In example 4, the subject matter of any of examples 1 to 3 can optionally furthermore comprise the fact that the sound detection unit is fixed to the holder substantially at the entire edge of said sound detection unit.

In example 5, the subject matter of any of examples 1 to 3 can optionally furthermore comprise the fact that the sound detection unit comprises a first edge section, which is fixed to the holder, and a second edge section, which is situated opposite the first edge section and which is not fixed to the holder and at which the first and second membranes are displaceable relative to the reference electrode by sound waves to be detected.

In example 6, the subject matter of examples 3 and 5 can optionally furthermore comprise the fact that the stiffening structure comprises at least one stiffening rib extending from the first edge section of the sound detection unit to the second edge section of the sound detection unit, wherein the stiffening structure optionally comprises a plurality of stiffening ribs extending from the first edge section of the sound detection unit to the second edge section of the sound detection unit.

In example 7, the subject matter of example 6 can optionally furthermore comprise the fact that the at least one stiffening rib or the plurality of stiffening ribs extends substantially rectilinearly from the first edge section to the second edge section of the sound detection unit.

In example 8, the subject matter of any of examples 1 to 7 can optionally furthermore comprise the fact that the base section of the reference electrode is configured as a single layer formed from an electrically conductive material.

In example 9, the subject matter of any of examples 1 to 7 can optionally furthermore comprise the fact that the base section comprises a first electrode formed from an electrically conductive material and facing the first membrane, a second electrode formed from an electrically conductive material and facing the second membrane, and also an electrically insulating layer arranged between the first electrode and the second electrode.

In example 10, the subject matter of any of examples 1 to 9 can optionally furthermore comprise the fact that the first or/and the second membrane has/have at least in sections a shape that is complementary to the reference electrode.

In example 11, the subject matter of any of examples 1 to 10 can optionally furthermore comprise the fact that the first or/and the second membrane comprises/comprise a plurality of sections that are electrically insulated from one another, wherein one or a plurality of the sections that are electrically insulated from one another is situated opposite or are situated opposite the stiffening structure.

In example 12, the subject matter of any of examples 1 to 11 can optionally furthermore comprise the fact that the stiffening structure is formed at least in sections, optionally completely, from the same material as that region of the base section with which the stiffening structure is in physical contact, wherein the stiffening structure is optionally formed integrally with the base section.

In example 13, the subject matter of any of examples 1 to 12 can optionally furthermore comprise the fact that the stiffening structure is formed at least in sections, optionally completely, from a material that is different than a material of that region of the base section with which the stiffening structure is in physical contact.

In example 14, the subject matter of any of examples 1 to 13 can optionally furthermore comprise the fact that both the first and the second membrane are formed at least in sections from an electrically conductive material.

In example 15, the subject matter of example 14 can optionally furthermore comprises the fact that the first and second membranes are electrically connected to one another or are electrically insulated from one another.

In example 16, the subject matter of any of examples 1 to 15 can optionally furthermore comprise at least one spacer, optionally a plurality of spacers, between the first and second membranes, said spacer or spacers being configured to maintain a predefined distance between the first and second membranes.

In example 17, the subject matter of example 16 can optionally furthermore comprise the fact that at least one spacer, optionally a plurality of the spacers, further optionally each spacer, is in permanent physical contact with the first or/and the second membrane, optionally is configured integrally with the first or/and the second membrane.

In example 18, the subject matter of either of examples 16 and 17 can optionally furthermore comprise the fact that at least one spacer, optionally a plurality of the spacers, further optionally each spacer, is formed from an electrically conductive material or from an electrically insulating material.

In example 19, the subject matter of any of examples 16 to 18 can optionally furthermore comprise the fact that the reference electrode comprises at least one through opening which extends continuously in the thickness direction and through which a spacer extends without contact, optionally extends without contact in each position of the first or/and the second membrane relative to the reference electrode.

In example 20, the subject matter of example 19 can optionally furthermore comprise the fact that the reference electrode comprises a plurality of through openings which extend continuously in the thickness direction and through which a respective spacer extends without contact, optionally extends without contact in each position of the first or/and the second membrane relative to the reference electrode.

In example 21, the subject matter of any of examples 1 to 20 can optionally furthermore comprise the fact that the reference electrode comprises at least one reference electrode anti-stick projection, optionally a plurality of reference electrode anti-stick projections, at a surface facing the first membrane or/and at a surface facing the second membrane. At least one reference electrode anti-stick projection, optionally a plurality of reference electrode anti-stick projections, further optionally each reference electrode anti-stick projection, can be formed at least partly, optionally completely, from an electrically insulating material.

In example 22, the subject matter of any of examples 1 to 21 can optionally furthermore comprise the fact that the first membrane or/and the second membrane has/have at least one membrane anti-stick projection, optionally a plurality of membrane anti-stick projections, at a surface facing the reference electrode. At least one membrane anti-stick projection, optionally a plurality of membrane anti-stick projections, further optionally each membrane anti-stick projection, can be formed at least partly, optionally completely, from an electrically insulating material.

Example 23 is a method for producing a microelectromechanical microphone which can comprise a holder and a sound detection unit carried on the holder. The sound detection unit can comprise: a planar first membrane, a planar second membrane arranged at a distance from the first membrane, wherein at least one from the first and second membranes is formed at least partly from an electrically conductive material, a low-pressure chamber formed between the first membrane and the second membrane, a reduced gas pressure relative to normal pressure being present in said low-pressure chamber, a reference electrode arranged at least in sections in the low-pressure chamber, said reference electrode being formed at least in sections from an electrically conductive material, wherein the first and second membranes are displaceable relative to the reference electrode by sound waves to be detected, wherein the reference electrode comprises a planar base section and also a stiffening structure provided on the base section, said stiffening structure being provided on a side of the base section that faces the first membrane or/and on a side of the base section that faces the second membrane. The method can comprise: forming the first membrane on a substrate, depositing a first sacrificial material layer onto the first membrane, forming the reference electrode on the first sacrificial material layer, depositing a second sacrificial material layer onto the reference electrode, forming the second membrane on the second sacrificial material layer, removing a part of the first sacrificial material layer and of the second sacrificial material layer in order to form a chamber between the first membrane and the second membrane, producing a reduced gas pressure relative to normal pressure in the chamber and thereby forming the low-pressure chamber, closing the low-pressure chamber, and removing a part of the substrate in order to form the holder. In order to form the chamber between the first membrane and the second membrane, it is possible to remove the entire first sacrificial material layer or/and the entire second sacrificial material layer. In this case, if appropriate, the first and second sacrificial material layers must provide different delimiting means configured to separate the chamber from the external surroundings permanently in a gas-tight fashion.

In example 24, the subject matter of example 23 can optionally furthermore comprise: forming a negative mold for the stiffening structure of the reference electrode.

In example 25, the subject matter of example 24 can optionally furthermore comprises the fact that the negative mold is formed in the first sacrificial material layer.

In example 26, the subject matter of example 25 can optionally furthermore comprise the fact that forming at least one part of the negative mold comprises: forming at least one cutout in the substrate, forming the first membrane on the substrate in such a way that the first membrane defines at least one cutout on a side facing away from the holder, and depositing the first sacrificial material layer onto the side of the first membrane facing away from the holder in such a way that a side of the first sacrificial material layer facing away from the first membrane has at least one cutout which defines at least one part of the negative mold.

In example 27, the subject matter of either of examples 25 and 26 can optionally furthermore comprise the fact that forming at least one part of the negative mold comprises: removing sacrificial material from the first sacrificial material layer in order to form at least one cutout in the first sacrificial material layer, the shape of which is complementary to at least one part of the stiffening structure.

In example 28, the subject matter of any of examples 23 to 27 can optionally furthermore comprise: structuring the first or/and the second membrane into a plurality of sections that are electrically insulated from one another.

In example 29, the subject matter of any of examples 23 to 28 can optionally furthermore comprise: before forming the second membrane and before depositing the second sacrificial material layer, forming at least one through opening in the reference electrode, after depositing the second sacrificial material layer, forming at least one spacer cutout in the first and second sacrificial material layers, which extends through the at least one through opening in the reference electrode, wherein optionally the at least one spacer cutout has a smaller diameter than the at least one through opening in the reference electrode, and forming at least one spacer in the at least one spacer cutout.

In example 30, the subject matter of any of examples 23 to 29 can optionally furthermore comprise: forming at least one opening, optionally a plurality of openings, in the second membrane, through which a part of the first and second sacrificial material layers is removed in order to form the low-pressure chamber, and closing the at least one opening or the plurality of openings after producing the reduced gas pressure relative to normal pressure in the low-pressure chamber.

In example 31, the subject matter of any of examples 23 to 30 can optionally furthermore comprise the fact that, in order to form the holder, the substrate is removed in such a way that the holder is in physical contact with the first membrane only in a part of the edge of the first membrane, or that the holder is in physical contact with the first membrane along the entire edge of the first membrane.

What is claimed is:

1. A microelectromechanical microphone comprising:
   a holder; and
   a sound detection unit carried on the holder, the sound detection unit comprising
   a planar first membrane,
   a planar second membrane arranged at a distance from the first membrane, wherein at least one of the first membrane or the second membrane is formed at least partly from a first electrically conductive material,
   a low-pressure chamber formed between the first membrane and the second membrane, a reduced gas pressure relative to normal pressure being present in said low-pressure chamber, and
   a reference electrode arranged at least in sections in the low-pressure chamber, said reference electrode being formed at least in sections from a second electrically conductive material, wherein the first and second membranes are displaceable relative to the reference electrode by sound waves to be detected, wherein the reference electrode comprises a planar base section and a stiffening structure provided on the base section, said stiffening structure provided on a side of the base section that faces the first membrane or/and on a side of the base section that faces the second membrane.

2. The microelectromechanical microphone as claimed in claim 1, wherein the stiffening structure is provided on a single side of the base section that faces the first membrane or the second membrane.

3. The microelectromechanical microphone as claimed in claim 1, wherein the stiffening structure comprises at least one stiffening rib protruding from the base section.

4. The microelectromechanical microphone as claimed in claim 1, wherein the sound detection unit is fixed to the holder substantially at an entire edge of said sound detection unit.

5. The microelectromechanical microphone as claimed in claim 1, wherein the sound detection unit comprises:
   a first edge section fixed to the holder, and
   a second edge section that is situated opposite the first edge section and is not fixed to the holder, wherein the first and second membranes are displaceable at the second edge section relative to the reference electrode by the sound waves to be detected.

6. The microelectromechanical microphone as claimed in claim 5, wherein the stiffening structure comprises at least one stiffening rib extending from the first edge section of the sound detection unit to the second edge section of the sound detection unit.

7. The microelectromechanical microphone as claimed in claim 6, wherein the at least one stiffening rib extends substantially rectilinearly from the first edge section to the second edge section of the sound detection unit.

8. The microelectromechanical microphone as claimed in claim 1, wherein the base section of the reference electrode is configured as a single layer formed from the second electrically conductive material.

9. The microelectromechanical microphone as claimed in claim 1, wherein the base section comprises a first electrode formed from the second electrically conductive material and facing the first membrane, a second electrode formed from the second electrically conductive material and facing the second membrane, and an electrically insulating layer arranged between the first electrode and the second electrode.

10. The microelectromechanical microphone as claimed in claim 1, wherein the first or/and the second membrane has/have at least in sections a shape that is complementary to the reference electrode.

11. The microelectromechanical microphone as claimed in claim 1, wherein the first or the second membrane comprises a plurality of sections that are electrically insulated from one another, wherein one or a plurality of the sections that are electrically insulated from one another is situated opposite or are situated opposite the stiffening structure.

12. The microelectromechanical microphone as claimed in claim 1, wherein the stiffening structure is formed at least in sections from the same material as a region of the base section with which the stiffening structure is in physical contact.

13. The microelectromechanical microphone as claimed in claim 1, wherein the stiffening structure is formed at least in sections from a material that is different than a material of a region of the base section with which the stiffening structure is in physical contact.

14. The microelectromechanical microphone as claimed in claim 1, wherein both the first and the second membrane are formed at least in sections from the first electrically conductive material.

15. The microelectromechanical microphone as claimed in claim 1, further comprising:
   at least one spacer disposed between the first and second membranes.

16. The microelectromechanical microphone as claimed in claim 15, wherein the reference electrode comprises at least one through opening that extends continuously in a thickness direction and through which the at least one spacer extends without contact in each position of the first or/and the second membrane relative to the reference electrode.

17. A method for producing a microelectromechanical microphone comprising a holder and a sound detection unit carried on the holder the sound detection unit comprising a planar first membrane, a planar second membrane arranged at a distance from the first membrane, wherein at least one of the first membrane or the second membrane is formed at least partly from a first electrically conductive material, a low-pressure chamber formed between the first membrane and the second membrane, a reduced gas pressure relative to normal pressure being present in said low-pressure chamber, a reference electrode arranged at least in sections in the low-pressure chamber, said reference electrode being formed at least in sections from a second electrically conductive material, wherein the first and second membranes are displaceable relative to the reference electrode by sound waves to be detected, wherein the reference electrode comprises a planar base section and also a stiffening structure provided on the base section, said stiffening structure being provided on a side of the base section that faces the first membrane or/and on a side of the base section that faces the second membrane, wherein the method comprises:
   forming the first membrane on a substrate;
   depositing a first sacrificial material layer onto the first membrane;
   forming the reference electrode on the first sacrificial material layer;
   depositing a second sacrificial material layer onto the reference electrode;

forming the second membrane on the second sacrificial material layer;

removing a part of the first sacrificial material layer and of the second sacrificial material layer in order to form a chamber between the first membrane and the second membrane;

producing the reduced gas pressure relative to normal pressure in the chamber, thereby forming the low-pressure chamber;

closing the low-pressure chamber; and removing a part of the substrate to form the holder.

18. The method as claimed in claim 17, further comprising forming a negative mold for the stiffening structure of the reference electrode.

19. The method as claimed in claim 18, wherein the negative mold is formed in the first sacrificial material layer.

20. The method as claimed in claim 19, wherein forming at least one part of the negative mold comprises:

forming at least one cutout in the substrate;

forming the first membrane on the substrate in such a way that the first membrane defines at least one cutout on a side facing away from the holder; and depositing the first sacrificial material layer onto the side of the first membrane facing away from the holder in such a way that a side of the first sacrificial material layer facing away from the first membrane has at least one cutout which defines at least one part of the negative mold.

21. The method as claimed in claim 19, wherein forming at least one part of the negative mold comprises removing sacrificial material from the first sacrificial material layer in order to form at least one cutout in the first sacrificial material layer, a shape of which is complementary to at least one part of the stiffening structure.

22. The method as claimed in claim 17, further comprising structuring the first or/and the second membrane into a plurality of sections that are electrically insulated from one another.

23. The method as claimed in claim 17, further comprising:

before forming the second membrane and before depositing the second sacrificial material layer, forming at least one through opening in the reference electrode;

after depositing the second sacrificial material layer, forming at least one spacer cutout in the first and second sacrificial material layers, which extends through the at least one through opening in the reference electrode, wherein optionally the at least one spacer cutout has a smaller diameter than the at least one through opening in the reference electrode; and forming at least one spacer in the at least one spacer cutout.

24. The method as claimed in claim 17, further comprising:

forming at least one opening in the second membrane through which a part of the first and second sacrificial material layers is removed to form the low-pressure chamber; and closing the at least one opening after producing the reduced gas pressure relative to normal pressure in the low-pressure chamber.

25. The method as claimed in claim 17, wherein, removing the part of the substrate to form the holder comprises removing the part of the substrate to cause the holder to be physical contact with the first membrane only in a part of an edge of the first membrane, or to cause the holder to be in physical contact with the first membrane along the entire edge of the first membrane.

* * * * *